(12) United States Patent
Ota

(10) Patent No.: US 6,417,718 B1
(45) Date of Patent: Jul. 9, 2002

(54) SEMICONDUCTOR DEVICE WITHOUT LIMITATION ON INSERT ORIENTATION ON BOARD

(75) Inventor: Akiko Ota, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 6 days.

(21) Appl. No.: 09/598,466

(22) Filed: Jun. 22, 2000

(30) Foreign Application Priority Data

Dec. 22, 1999 (JP) .......................................... 11-364688

(51) Int. Cl.7 .............................................. H03K 17/62
(52) U.S. Cl. .......................................... 327/407; 327/99
(58) Field of Search .......................... 327/407–411, 99, 327/564–566; 361/733

(56) References Cited

U.S. PATENT DOCUMENTS

| | | | | |
|---|---|---|---|---|
| 4,945,267 A | * | 7/1990 | Galbraith | 327/566 |
| 5,444,664 A | * | 8/1995 | Kuroda et al. | 365/226 |
| 5,661,420 A | * | 8/1997 | Killion et al. | 327/29 |
| 6,169,418 B1 | * | 1/2001 | Wagner | 327/565 |

FOREIGN PATENT DOCUMENTS

| | | |
|---|---|---|
| JP | 60-73257 | 5/1985 |
| JP | 1-120045 | 5/1989 |
| JP | 10-303366 | 11/1998 |
| JP | 10-313091 | 11/1998 |

* cited by examiner

*Primary Examiner*—Kenneth B. Wells
(74) *Attorney, Agent, or Firm*—McDermott, Will & Emery

(57) ABSTRACT

An internal input voltage generating/external output voltage generating circuit is provided within a semiconductor device, a voltage on a pad corresponding to a supply pin terminal is detected to specify the inserted orientation of the semiconductor device based on the detection result and apply a correct voltage to a chip internal circuit. According to the specified direction, one of a plurality of pin terminals located in rotation or line-symmetry is selected to couple the selected terminal to the chip internal circuit. Accordingly, a semiconductor device can be implemented that is never damaged and operates normally even if the device is mounted on a circuit board in any possible orientation which the device can take upon board mounting.

10 Claims, 16 Drawing Sheets

ONE OF PAIRED PIN TERMINALS IN LINE-SYMMETRY IS SELECTED BASED ON VOLTAGE ON TERMINAL 32A-0 AND 32B-0

FRONT AND REAR INDISTINGUISHED  4 STATES POSSIBLE

FRONT AND REAR INDISTINGUISHED  8 STATES POSSIBLE

SEMICONDUCTOR DEVICE WITHOUT LIMITATION ON INSERT ORIENTATION ON BOARD

BACKGROUND OF THE INVENTION

1. Field of the Invention

The present invention relates to semiconductor devices, and particularly to a semiconductor device which can always operate normally upon mounting on the printed circuit board after packaging, regardless of the orientation in which the device is inserted onto a circuit board.

2. Description of the Background Art

FIG. 22 is a schematic illustrating a structure of a conventional semiconductor device. Referring to FIG. 22, semiconductor device 1 is rectangular in shape, and has pin terminals 2A-0 to 2A-n arranged along one longer side for electric connection to an external device and pin terminals 2B-0 to 2B-n arranged along the other longer side for electric connection to an external device. Power supply voltage VCC is applied to pin terminal 2A-0 and ground voltage VSS is applied to pin terminal 2B-0 which is point-symmetrical to pin terminal 2A-0.

Pin terminals 2A-1 to 2A-n receive signals A1 to An respectively and pin terminals 2B-1 to 2B-n receive signals B1 to Bn respectively. Although pin terminals 2A-1 to 2A-n and 2B-1 to 2B-n are illustrated as input/output pin terminals for input/output of signals, these pins may be input pin terminals or output pin terminals.

Semiconductor device 1 further includes pads 3A-0 to 3A-n and 3B-0 to 3B-n provided corresponding to respective pin terminals 2A-0 to 2A-n and 2B-0 to 2B-n. Pads 3A-0 to 3A-n and 3B-0 to 3B-n are connected electrically to corresponding pin terminals 2A-0 to 2A-n and 2B-0 to 2B-n via bonding wires, respectively.

Supply voltage VCC applied to pin terminal 2A-0 is supplied to a chip internal circuit 6 via pad 3A-0 and ground voltage VSS applied to pin terminal 2B-0 is supplied to chip internal circuit 6 via pad 3B-0. Chip internal circuit 6 may perform a predetermined processing using supply voltage VCC applied to pin terminal 2A-0 as one operating supply voltage, or chip internal circuit 6 may be configured to lower supply voltage VCC applied to pin terminal 2A-0 to generate an operating supply voltage.

Buffer circuits 4A-1 to 4A-n are arranged corresponding to pads 3A-1 to 3A-n respectively and buffer circuits 4B-1 to 4B-n are arranged corresponding to pads 3B-1 to 3B-n respectively. Although buffer circuits 4A-1 to 4A-n and 4B-1 to 4B-n are illustrated as input/output buffer circuits, they may be input buffer circuits or output buffer circuits. These buffer circuits 4A-1 to 4A-n and 4B-1 to 4B-n serve as an interface for signals between an external device and chip internal circuit 6 to buffer those signals supplied respectively thereto and transmit the buffered signals to chip internal circuit 6 or the external device.

A package of semiconductor device 1 as shown in FIG. 22 is usually called DIL (Dual In Line) package having pin terminals arranged along the longer sides of the rectangular package. In this structure, semiconductor device 1 formed on a semiconductor chip is sealed by such a package and electrically connected to an external device via the pin terminals. In this way, fine-processed semiconductor device 1 can be connected electrically to any external device via pin terminals 2A-0 to 2A-n and 2B-0 to 2B-n. Further, when the semiconductor device is inserted to a circuit board, pin terminals 2A-0 to 2A-n and 2B-0 to 2B-n enable the semiconductor device to be mounted on the circuit board easily.

For semiconductor device 1 shown in FIG. 22, pin terminals 2A-0 to 2A-n and 2B-0 to 2B-n are arranged in alignment in the direction of the longer sides of the rectangular device, each pin terminal is specified by a pin number, and a predetermined signal/voltage is input/output to/from each pin terminal. Pin terminals 2A-0 to 2A-n and 2B-0 to 2B-n are formed of a leadframe and all are identical in shape. In order to clearly distinguish the top and bottom of semiconductor device 1, a mark (concave) 20 indicating the top/bottom is formed on one of the shorter sides on a surface of the package of semiconductor device 1 as shown FIG. 23. Concave 20 indicates the top/bottom of the semiconductor device. Even with semiconductor device 1 upside-down, the pin terminals can be inserted to an IC socket, for example, of a circuit board since the pin terminals have the same pitch.

If semiconductor device 1 is mounted on the circuit board with its top and bottom reversed and power is supplied to the entire circuit board, signals/voltages applied to the pin terminals are not normal ones so that a normal operation of semiconductor device 1 is impossible. In general, in order to prevent short circuit in the DIL package, pin terminal 2A-0 receiving supply voltage VCC and pin terminal 2B-0 receiving ground voltage VSS are arranged point-symmetrically to each other as shown in FIG. 22. If semiconductor device 1 having such a pin arrangement is mounted on the circuit board with its top and bottom reversed, or upside down, positions of pin terminals 2A-0 and 2B-0 are replaced with each other. Consequently, pin terminal 2B-0 which should receive ground voltage VSS receives supply voltage VCC and pin terminal 2A-0 which should receive supply voltage VCC receives ground voltage VSS. Thus, a ground line which should be fixed at ground voltage VSS is set at supply voltage VCC level in chip internal circuit 6 of semiconductor device 1, resulting in a large current flow therein which generates heat and resultant damage to internal elements due to the generated heat. Such a large current flows through a path discussed below, for example.

FIG. 24 shows a structure of a signal input portion of semiconductor device 1. Referring to FIG. 24, a pad PD is coupled to a buffer circuit BF by a signal line SG. A diode DF0 is connected between signal line SG and a supply node PS0 and a diode DF1 is connected between signal line SG and a supply node (ground node) PS1. Diode DF0 has its anode connected to signal line SG and its cathode connected to supply node PS0. Diode DF1 has its anode connected to ground node PS1 and its cathode connected to signal line SG.

When semiconductor device 1 is inserted to a circuit board in a normal orientation, supply node PS0 and ground node PS1 receive supply voltage VCC and ground voltage VSS, respectively. A positive surge voltage applied to pad PD is discharged to supply node PS0 via diode DF0. If a negative surge voltage is generated on pad PD, diode DF1 becomes conductive to cause current to flow from ground node PS1 to signal line SG and accordingly the negative surge voltage is absorbed.

If semiconductor device 1 is inserted to the circuit board in the opposite orientation, ground voltage VSS is applied to supply node PS0 and supply voltage VCC is applied to ground node PS1. In this case, diodes DF1 and DF0 are always in ON state, so that a large current constantly flows through this path.

Further, in the chip internal circuit, an output level of a logic gate circuit and the like is inverted. If this insertion of the device in the opposite orientation causes all logic levels of internal signals to be inverted, or of an output signal of a row decoder and a logic level (voltage level) of a word line drive signal in a semiconductor memory device change, for example, a word line which should be grounded when it is not selected is driven to the supply voltage VCC level, causing a large current in a word line drive portion.

If such semiconductor device 1 is mounted in the reverse orientation on the circuit board, a problem arises that failure occurs in the semiconductor device and accordingly the overall system cannot operate normally.

For adaptation to the insertion to the circuit board of a semiconductor device in the reverse orientation, a structure has been devised in which the internal circuit is set into an in-operable state or a method has been devised of connecting circuits having the same function to pin terminals arranged symmetrically to each other. However, nothing has been devised for adapting to application of the opposite voltage polarities to power supply terminals (supply terminal and ground terminal) respectively.

Not only the DIL package but a QFP (Quad Flat Package) and a BGA (Ball Grid Array) package having pin terminals arranged along the four sides thereof have the problem as above discussed.

As an alternative structure for allowing the semiconductor device to operate normally even if the device is mounted in the reverse orientation on a circuit board, pin terminals having the same function may be symmetrically arranged in order to enable the chip internal circuit to receive normal signals/voltages. However, this structure causes increase in the number of pin terminals since a plurality of pin terminals having the same function should be arranged for adaptation to possible insertion orientations of the semiconductor device. Consequently, the size of the entire package increases which is contrary to the current trend to a smaller-sized system construction.

In addition, if the number of devices on the circuit board increases, the fixed functions of the pin terminals of the semiconductor device complicate the interconnection layout, resulting in inefficient arrangement of the semiconductor devices.

SUMMARY OF THE INVENTION

An object of the present invention is to provide a semiconductor device which can operate normally regardless of the inserted orientation of device upon mounting on a circuit board, without increase in the number of pin terminals.

Another object of the invention is to provide a semiconductor device which interconnection layout on a circuit board can be simplified.

A semiconductor device according to the present invention includes a plurality of terminals, an internal circuit receiving voltage on an internal node as one operating supply voltage, and a selection circuit coupled to the plurality of terminals for selecting, according to voltages on the plurality of terminals, a voltage to be transmitted to the internal node from the voltages on the terminals and transmitting the selected voltage to the internal node.

A voltage is selected from voltages on the plurality of terminals according to the voltages on the terminals and the selected voltage is transmitted to the internal node coupled to the internal circuit. Even if the voltages on these terminals are different from those in the normal state, a normal voltage can be applied accurately to the internal circuit and thus the semiconductor device can operate normally regardless of the inserted orientation of the device.

Further, the semiconductor device can be mounted on a circuit board without consideration of the inserted orientation of the semiconductor device so that the mounting process of the semiconductor device can be simplified.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
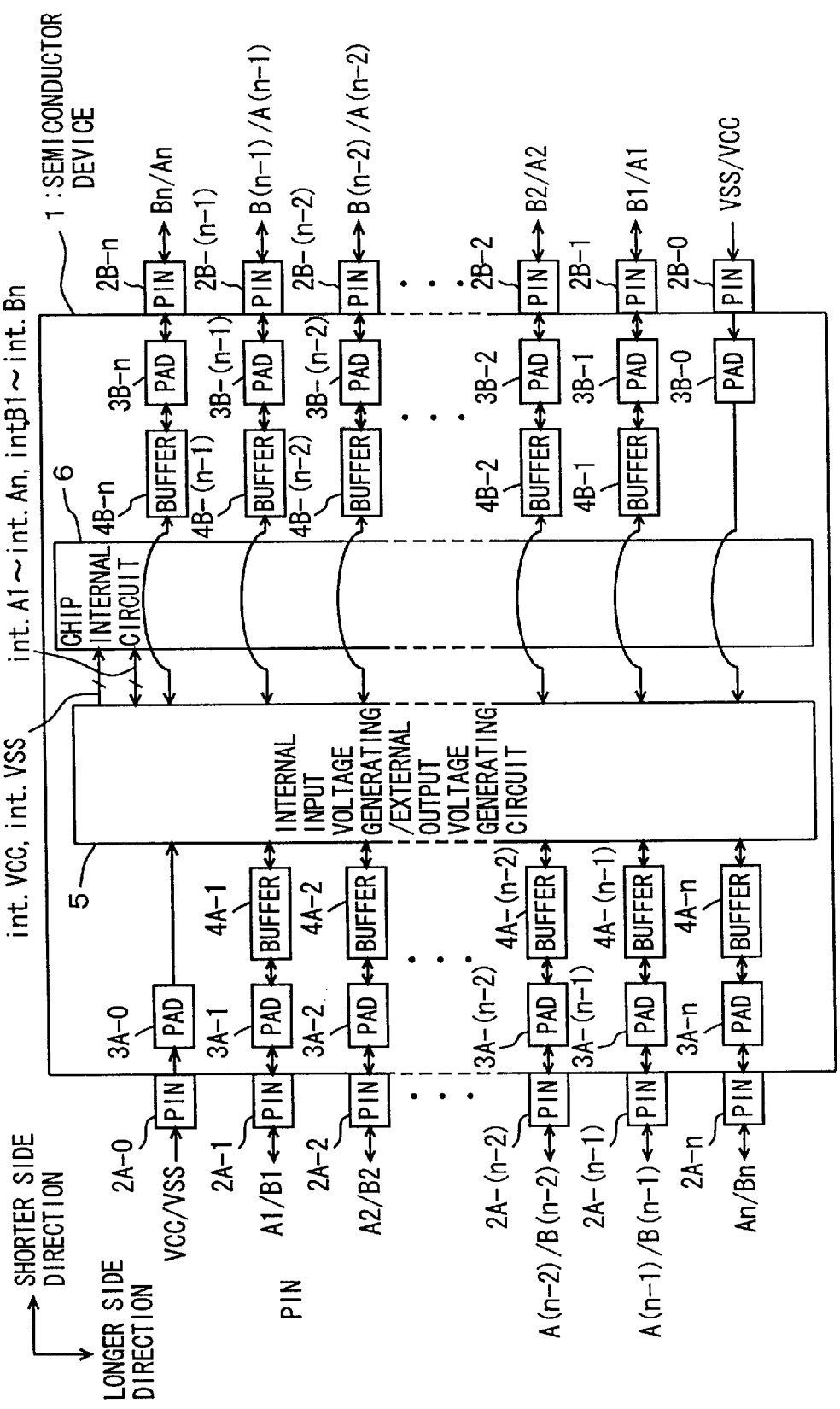
FIG. 1 is a schematic showing a main portion of a semiconductor device according to a first embodiment of the invention.
Figure 23:
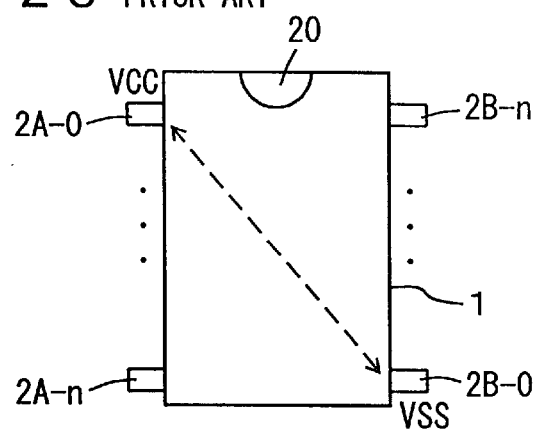
FIG. 23 is a schematic showing a shape of a package of the conventional semiconductor device.
Figure 24:
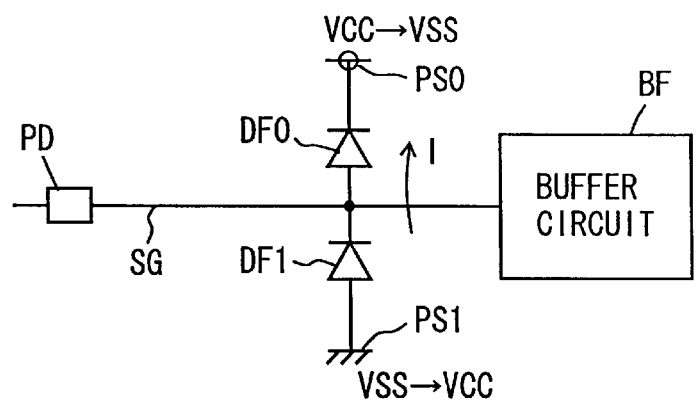
FIG. 24 is a diagram for illustrating a problem of the conventional semiconductor device.

FIG. 1 is a schematic showing an entire structure of a semiconductor device according to the first embodiment of the invention. Semiconductor device 1 shown in FIG. 1 is rectangular in shape, having longer and shorter sides, and even if semiconductor device 1 is turned 180° about the center thereof, its shape and pin arrangement remain the same (pin terminals are differently numbered). In other words, although the front and rear as well as lengthwise and widthwise directions of semiconductor device 1 are clearly distinguishable, the appearance thereof is the same even if the device is turned 180° about the center thereof. The lengthwise and widthwise directions can be distinguished by the longer and shorter sides, and the front and rear is identified by the direction in which pin terminals extend or by a concave as shown in FIG. 23.

Semiconductor device 1 has pin terminals 2A-0 to 2A-n arranged along one longer side and pin terminals 2B-0 to 2B-n arranged along the other longer side as well as pads 3A-0 to 3A-n and 3B-0 to 3B-n arranged corresponding to respective pin terminals 2A-0 to 2A-n and 2B-0 to 2B-n as in the conventional semiconductor device. Power supply terminals 2A-0 and 2B-0 are each provided on either longer side of semiconductor device 1 such that they are opposite to each other in the diagonal direction.

Buffer circuits 4A-1 to 4A-n and 4B-1 to 4B-n are provided in order to buffer signals applied to corresponding pads 3A-1 to 3A-n and 3B-1 to 3B-n. These buffer circuits 4A-1 to 4A-n and 4B-1 to 4B-n each may be any of an input buffer circuit, an output buffer circuit and an input/output buffer circuit.

When the semiconductor device is inserted in a first orientation, pin terminals 2A-0 and 2B-0 receive supply voltage VCC and ground voltage VSS, respectively. When the semiconductor device is inserted in a second orientation opposite to the first orientation, pin terminals 2A-0 and 2B-0 receive ground voltage VSS and supply voltage VCC, respectively. On a circuit board, a voltage/signal to be transmitted is fixedly determined by an interconnection line. Therefore, different voltages/signals are coupled to each pin terminal depending on the inserted orientation of semiconductor device 1. Referring to FIG. 1, for each pin terminal, a voltage/signal applied to the semiconductor device 1 in the first orientation on a circuit board is indicated on the left side of the slash mark, and a voltage/signal applied to the semiconductor device in the second orientation opposite to the first orientation is shown on the right side of the slash mark.

Semiconductor device 1 according to the first embodiment further includes an internal input voltage generating/external output voltage generating circuit 5 coupled to buffer circuits 4A-1 to 4A-n and 4B-1 to 4B-n, which performs a selecting operation on buffer circuits 4A-1 to 4A-n and 4B-1 to 4B-n, according to voltages on pads 3A-0 and 3B-0, such that the same normal signal/voltage is always supplied to each internal node of a chip internal circuit 6 regardless of the inserted orientation (first/second orientation), and which accurately applies internal supply voltage intVCC and internal ground voltage intVSS to chip internal circuit 6 according to the voltages applied onto pads 3A-0 and 3B-0.

In order to allow chip internal circuit 6 to normally operate regardless of whether the inserted orientation of semiconductor device 1 is in the first orientation or in the opposite second orientation, internal input voltage generating/external output voltage generating circuit 5 changes connection between chip internal circuit 6 and each pad. In this way, semiconductor device 1 can always operate normally regardless of the inserted orientation of semiconductor device 1. An operation of the semiconductor device is briefly described below.

One of supply voltage VCC and ground voltage VSS is applied to pin terminal 2A-0 and the other thereof is applied to pin terminal 2B-0. When the mounted semiconductor device 1 is in the first orientation, pin terminals 2A-0 and 2B-0 receive supply voltage VCC and ground voltage VSS respectively, pin terminals 2A-1 to 2A-n are coupled to signals A1 to An respectively, and pin terminals 2B-1 to 2B-n are coupled to signals B1 to Bn respectively. Signals/voltages are transmitted between pin terminals 2A-1 to 2A-n and 2B-1 to 2B-n and corresponding buffer circuits 4A-1 to 4A-n and 4B-1 to 4B-n via corresponding pads 3A-1 to 3A-n and 3B-1 to 3B-n.

According to voltages VCC and VSS applied from pads 3A-0 and 3B-0, internal input voltage generating/external output voltage generating circuit 5 determines the inserted orientation of semiconductor device 1. According to the result of determination, voltage generating circuit 5 couples buffer circuits 4A-1 to 4A-n and 4B-1 to 4B-n respectively to signal input/output nodes in the normal state to chip internal circuit 6 of semiconductor device 1. Specifically, when the mounted semiconductor device 1 is in the first orientation, internal input voltage generating/external output voltage generating circuit 5 receives voltages VCC and VSS applied to respective pads 3A-0 and 3B-0, and applies internal supply voltage intVCC and internal ground voltage intVSS respectively to a supply node and a ground node of chip internal circuit 6. Accordingly, operating supply voltage is normally fed to chip internal circuit 6. Similarly, according to voltages on pads 3A-0 and 3B-0, internal input voltage generating/external output voltage generating circuit 5 couples buffer circuits 4A-1 to 4A-n and 4B-1 to 4B-n to respective internal nodes in the normal state of chip internal circuit 6.

Specifically, when the semiconductor device 1 is inserted in the normal state or in the first orientation, buffer circuits 4A-1 to 4A-n and 4B-1 to 4B-n are coupled to respective nodes of chip internal circuit 6 which receive internal signals intA1 to intAn and intB1 to intBn. Internal signals intA1 to intAn and intB1 to intBn each may be any of an input signal and an output signal.

When semiconductor device 1 is inserted in the second orientation with ground voltage VSS and supply voltage VCC applied to pin terminals 2A-0 and 2B-0 respectively, internal input voltage generating/external output voltage generating circuit 5 changes connection between buffer circuits 4A-1 to 4A-n and 4B-1 to 4B-n and internal nodes of chip internal circuit 6. Since signals B1 to Bn are coupled respectively to buffer circuits 4A-1 to 4A-n, internal input voltage generating/external output voltage generating circuit 5 couples buffer circuits 4A-1 to 4A-n to internal nodes of chip internal circuit 6 which correspond to signals B1 to Bn respectively. Since buffer circuits 4B-1 to 4B-n correspond to signals A1 to An respectively, internal input voltage generating/external output voltage generating circuit 5 couples buffer circuits 4B-1 to 4B-n to respective internal nodes of chip internal circuit 6 which correspond respectively to signals A1 to An.

In this way, regardless of the inserted orientation of semiconductor device 1, chip internal circuit 6 can always input/output internal signals in the same state as the state in which the semiconductor device mounted is in the normal state or in the first orientation. This similarly applies to supply voltage VCC and ground voltage VSS.

According to voltages on pads 3A-0 and 3B-0, internal input voltage generating/external output voltage generating circuit 5 specifies the inserted orientation and determines paths through which signals/voltages are propagated based on the result of the specification, for each pair of the pin terminals 2A-0 to 2A-n and 2B-0 to 2B-n with correlated pin terminals corresponding between the normal state (first orientation) and the opposite state (in the second orientation) paired.

Figure 2:
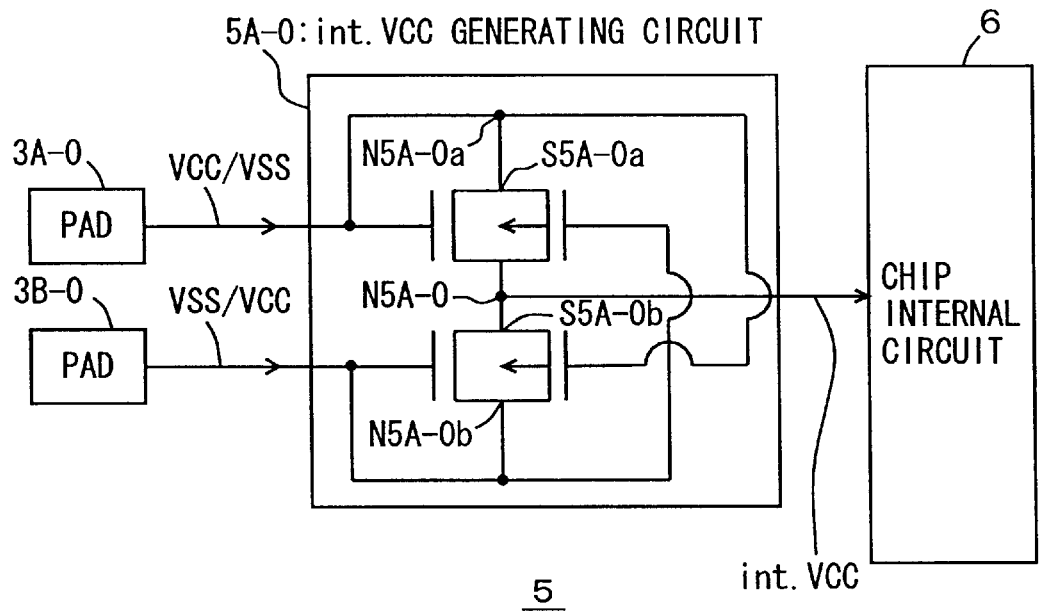
FIG. 2 is a schematic showing a structure of an internal supply voltage generating circuit included in an internal input voltage generating/external output voltage generating circuit shown in FIG. 1.

FIG. 2 shows a structure of an internal supply voltage (intVCC) generating circuit 5A-0 included in internal input voltage generating/external output voltage generating circuit 5 in FIG. 1. Referring to FIG. 2, internal supply voltage generating circuit 5A-0 includes CMOS transmission gates S5A-0a and S5A-0b provided corresponding to respective pads 3A-0 and 3B-0 and made conductive complementarily to each other, in response to voltages on pads 3A-0 and 3B-0, to transmit the voltages on corresponding pads to an internal supply node N5A-0 of chip internal circuit 6. CMOS transmission gate S5A-0a becomes conductive, when supply voltage VCC is applied to pad 3A-0 and ground voltage VSS is applied to pad 3B-0, to transmit voltage VCC applied onto pad 3A-0 to internal supply node N5A-0 of chip internal circuit 6. As shown in FIG. 1, pads 3A-0 and 3B-0 are arranged corresponding to pin terminals opposite to each other in the diagonal direction of semiconductor device 1, and voltages thereon are transmitted to internal supply voltage generating circuit 5A-0 through an internal interconnection line in internal input voltage generating/external output voltage generating circuit 5. The voltages on pads 3A-0 and 3B-0 specify the inserted orientation of the device.

When ground voltage VSS and supply voltage VCC are applied to pads 3A-0 and pad 3B-0 respectively, a node N5A-0a is at ground voltage VSS level and a node N5A-0b is at supply voltage VCC level and CMOS transmission gates S5A-0a and S5A-0b enter OFF and ON states, respectively. Accordingly, internal supply node N5A-0 of chip internal circuit 6 is coupled to node N5A-0b via transmission gate S5A-0b and receives voltage VCC applied to pad 3B-0. Thus, internal supply node N5A-0 of chip internal circuit 6 always receives internal supply voltage intVCC and chip internal circuit 6 can receive internal supply voltage intVCC normally regardless of the inserted orientation of semiconductor device 1.

Figure 3:
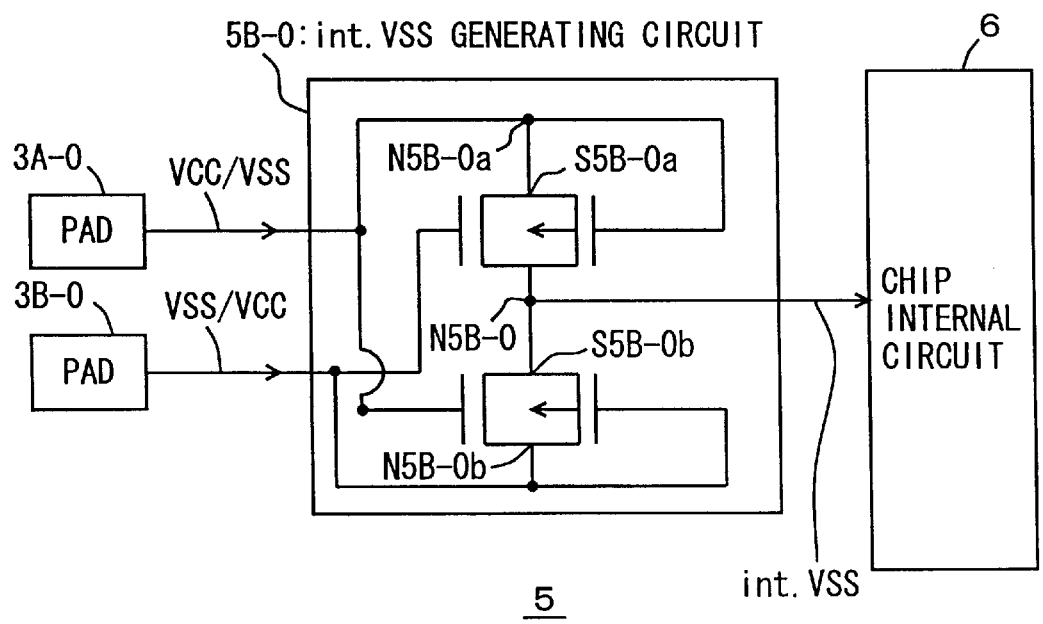
FIG. 3 shows a structure of an internal ground voltage generating circuit included in the internal input voltage generating/external output voltage generating circuit shown in FIG. 1.

FIG. 3 shows a structure of an internal ground voltage (intVSS) generating circuit 5B-0 included in internal input voltage generating/external output voltage generating circuit 5 for generating internal ground voltage intVSS. Referring to FIG. 3, internal ground voltage generating circuit 5B-0 includes CMOS transmission gates S5B-0a and S5B-0b that are provided corresponding to pads 3A-0 and 3B-0 respectively and become conductive complementarily to each other, in response to voltages on respective pads 3A-0 and 3B-0, to transmit voltages on the corresponding pads to an internal ground node N5B-0 when conductive. CMOS transmission gate S5B-0a transmits the voltage on pad 3A-0 to internal ground node N5B-0 when conductive, while CMOS transmission gate S5B-0b transmits the voltage on pad 3B-0 to internal ground node N5B-0 when conductive.

When supply voltage VCC and ground voltage VSS are applied respectively to pads 3A-0 and 3B-0, CMOS transmission gate S5B-0b enters ON state and CMOS transmission gate S5B-0a enters OFF state, and internal ground node N5B-0 is coupled to pad 3B-0 via node N5B-0b. Accordingly, ground voltage VSS applied to pad 3B-0, is fed to internal ground node N5B-0 and chip internal circuit 6 receives the voltage on internal ground node N5B-0 as internal ground voltage intVSS.

When ground voltage VSS and supply voltage VCC are applied to pads 3A-0 and 3B-0 respectively, CMOS transmission gate S5B-0a enters ON state while CMOS transmission gate S5B-0b enters OFF state. Under this condition, internal ground node N5B-0 is electrically coupled to pad 3A-0 via CMOS transmission gate S5B-0a and node N5B-0a and ground voltage VSS on pad 3A-0 is transmitted to internal ground node N5B-0. Regardless of the inserted orientation of semiconductor device, chip internal circuit 6 always receives internal ground voltage intVSS via internal ground node N5B-0.

In this way, after the semiconductor device is mounted on the circuit board, chip internal circuit 6 always receives internal supply voltage intVCC via internal supply node N5A-0 and receives internal ground voltage intVSS via internal ground node N5B-0 regardless of the inserted orientation upon mounting. Accordingly, supply voltage VCC and ground voltage VSS are never applied in reverse manner to chip internal circuit 6 and thus components of the semiconductor device are prevented from being damaged due to heat generation.

Figure 4:
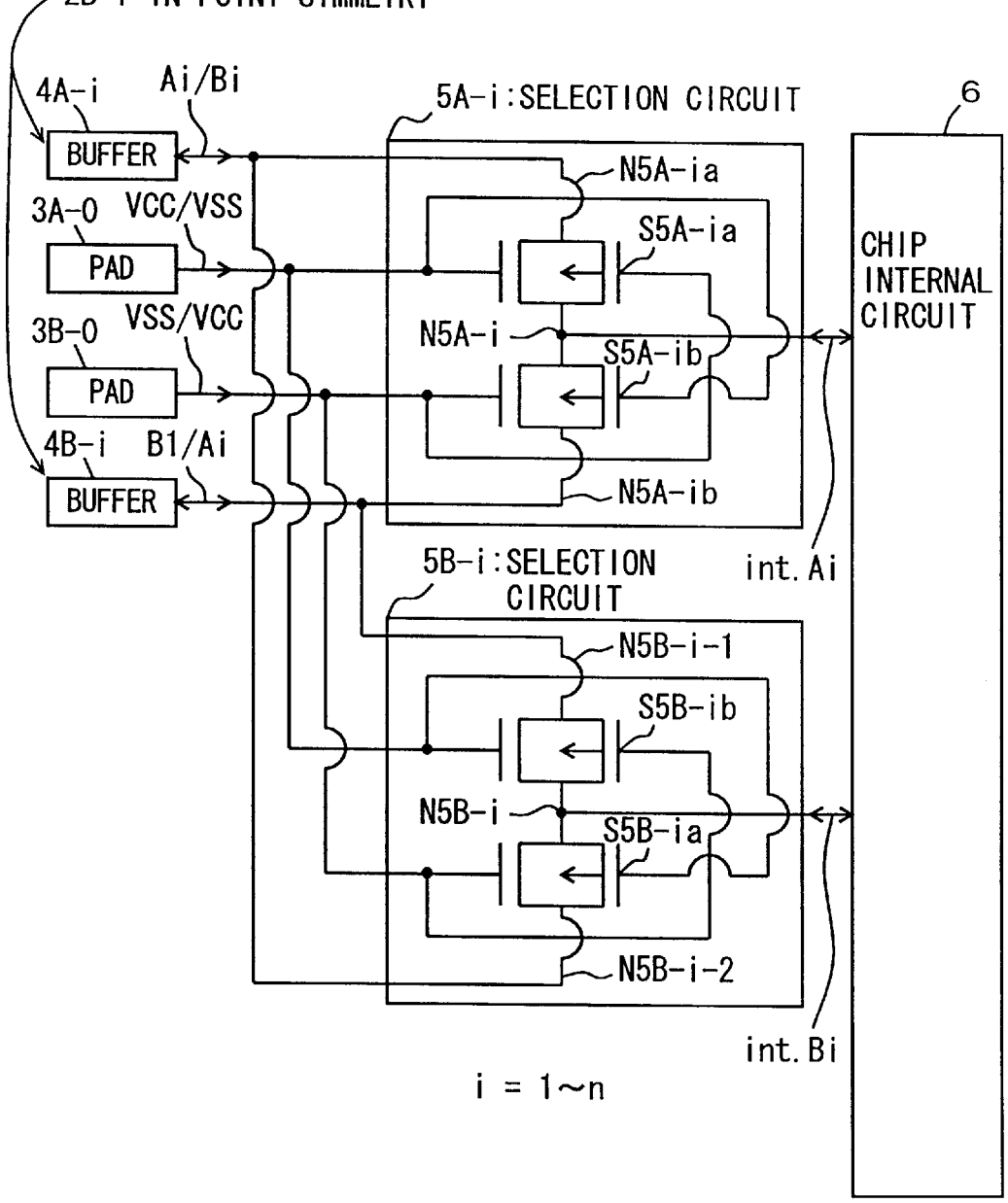
FIG. 4 shows a structure of a signal selection circuit included in the internal input voltage generating/external output voltage generating circuit shown in FIG. 1.

FIG. 4 shows a structure of a selection circuit corresponding to signals Ai and Bi of internal input voltage generating/external output voltage generating circuit 5 shown in FIG. 1. FIG. 4 shows a structure of an internal signal generating circuit corresponding to buffers 4A-i and 4B-i where i represents any of 1 to n. Buffer circuits 4A-i and 4B-i are coupled via respective pads 3A-i and 3B-i to respective pin terminals 2A-i and 2B-i arranged point-symmetrically to each other. Buffer circuits 4A-i and 4B-i each may be any of an input buffer, an output buffer and an input/output buffer. Here, buffer circuits 4A-i and 4B-i are only required to be of the same type, i.e. those buffer circuits are both input buffer circuits, output buffer circuits, or input/output buffer circuits. Buffer circuits 4A-i and 4B-i are coupled to signals Ai and Bi respectively.

Chip internal circuit 6 and buffer circuits 4A-i and 4B-i transmit internal signal intAi via an internal node N5A-i and transmit internal signal intBi via an internal node N5B-i.

For internal signal intAi, a selection circuit 5A-i for coupling one of buffer circuits 4A-i and 4B-i to internal node N5A-i in response to voltages on pads 3A-0 and 3B-0 is provided. For internal signal intBi, a selection circuit 5B-i for coupling one of buffer circuits 4A-i and 4B-i to internal node N5B-i in response to voltages on pads 3A-0 and 3B-0 is provided. These selection circuits 5A-i and 5B-i perform selecting operations complementarily to each other.

Selection circuit 5A-i includes: a CMOS transmission gate S5A-ia which selectively becomes conductive, in response to voltages on pads 3A-0 and 3B-0, to couple buffer circuit 4A-i to internal node N5A-i; and a CMOS transmission gate S5A-ib which becomes conductive, in response to voltages on pads 3A-0 and 3B-0, complementarily to CMOS transmission gate S5A-ia to couple buffer circuit 4B-i to internal node N5A-i.

Selection circuit 5B-i includes: a CMOS transmission gate S5B-ib which becomes conductive selectively, in response to voltages on pads 3A-0 and 3B-0, to couple buffer circuit 4B-i to internal node N5B-i; and a CMOS transmission gate S5B-ia which becomes conductive, in response to voltages on pads 3A-0 and 3B-0, complementarily to CMOS transmission gate S5B-ib to electrically couple buffer circuit 4A-i to internal node N5B-i. An operation of these circuits is briefly described below.

When the semiconductor device is mounted on the circuit board in the first orientation, supply voltage VCC and ground voltage VSS are applied to pin terminals 2A-0 and 2B-0 respectively, and supply voltage VCC and ground voltage VSS are applied to pads 3A-0 and 3B-0 respectively. In selection circuit 5A-i, CMOS transmission gate S5A-i and CMOS i transmission gate S5A-ia enter OFF and ON states respectively, and buffer circuit 4A-i is coupled to internal node N5A-i.

At this time, in selection circuit 5B-i, CMOS transmission gates S5B-ia and S5B-ib enter OFF and ON states respectively and buffer circuit 4B-i is coupled to internal node N5B-i. Accordingly, chip internal circuit 6 transmits internal signals intAi and intBi in respective directions fitting to the functions of buffer circuits 4A-i and 4B-i.

When semiconductor device 1 is inserted in the second orientation opposite to the first orientation, ground voltage VSS and supply voltage VCC are applied to pads 3A-0 and 3B-0 respectively. In this case, buffer circuits 4A-i and 4B-i are coupled respectively to receive external signals Bi and Ai from corresponding pin terminals 2A-i and 2B-i. Under this condition, in selection circuit 5A-i, CMOS transmission gates S5A-ia and S5A-ib enter OFF and ON states respectively, and buffer circuit 4B-i is coupled to internal node NSA-i. Accordingly, chip internal circuit 6 transmits internal signal intAi in the direction fitting to the function of buffer circuit 4B-i.

In selection circuit 5B-i, CMOS transmission gates S5B-ia and S5B-ib enter ON and OFF states respectively and internal node N5B-i is coupled to buffer circuit 4A-i. Accordingly, chip internal circuit 6 transmits internal signal intBi to buffer circuit 4A-i.

Regarding signals Ai and Bi, voltages on pads 3A-0 and 3B-0 specify the inserted orientation of the device, and a signal propagation path is selected according to the result of the specification. Therefore, regardless of the inserted orientation of the semiconductor device, the same and correct internal signal is always input/output to/from chip internal circuit 6. Even if a different signal is received or transmitted by a corresponding buffer circuit, the reception/transmission is accurately done from/to an external device so that a designated internal operation can be performed correctly.

As described above, according to the first embodiment of the invention, the propagation path of internal signal/voltage is changed according to voltage applied to a specific pad. Consequently, after the semiconductor is mounted on the circuit board, regardless of the inserted orientation of the semiconductor device, normal internal signals/voltages are always transmitted to the semiconductor device so that prevention of heat generation in the semiconductor device is possible and a normal operation of the semiconductor device is also possible to transmit/receive signals to/from any external device. Further, the semiconductor device can be mounted on the circuit board without consideration of the orientation of the device upon insertion, so that the mounting process can be simplified.

Second Embodiment

Figure 5:
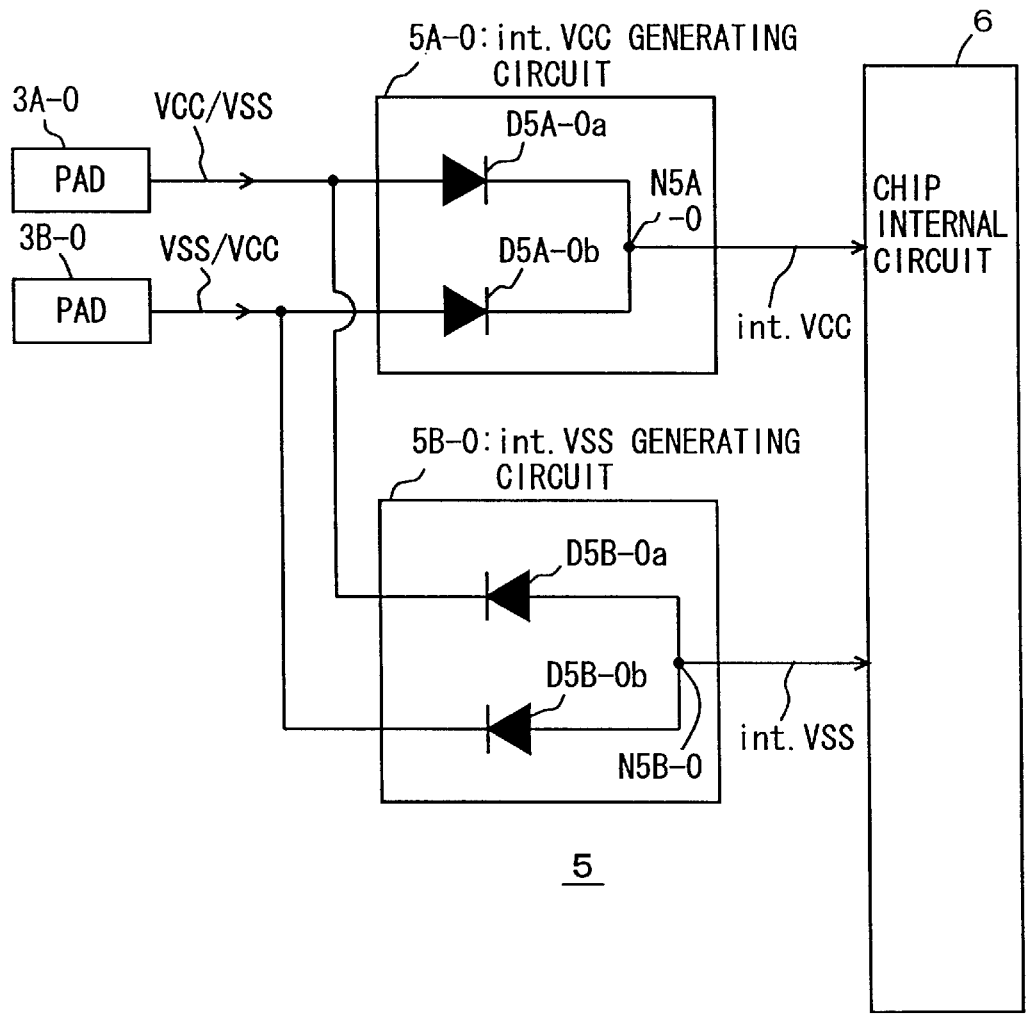
FIG. 5 shows a structure of an internal voltage generating circuit according to a second embodiment of the invention.

FIG. 5 shows a structure of an internal input voltage generating/external output voltage generating circuit 5 according to the second embodiment of the invention. FIG. 5 shows the structures of an internal supply voltage (intVCC) generating circuit 5A-0 generating internal supply voltage intVCC and of an internal ground voltage (intVSS) generating circuit 5B-0 generating internal ground voltage intVSS.

Referring to FIG. 5, internal supply voltage generating circuit 5A-0 includes a diode element D5A-0a connected between a pad 3A-0 and an internal supply node N5A-0 in the forward direction relative to pad 3A-0, and a diode element D5A-0b connected between a pad 3B-0 and internal supply node N5A-0 in the forward direction relative to pad 3B-0.

Internal ground voltage generating circuit 5B-0 includes a diode element D5B-0a connected between pad 3A-0 and an internal ground node N5B-0 in the reverse direction relative to pad 3A-0, and a diode element D5B-0b connected between pad 3B-0 and internal ground node N5B-0 in the reverse direction relative to pad 3B-0.

In internal supply voltage generating circuit 5A-0, when supply voltage VCC and ground voltage VSS are applied to pads 3A-0 and 3B-0 respectively, diode element D5A-0a becomes conductive to transmit supply voltage VCC applied to pad 3A-0 to internal supply node N5A-0. Diode element D5A-0b is biased in the reverse direction and maintained in OFF state, and thus pad 3B-0 is isolated from internal supply node N5A-0.

When ground voltage VSS and supply voltage VCC are applied to pads 3A-0 and 3B-0 respectively, diode element D5A-0b becomes conductive to transmit supply voltage VCC on pad 3B-0 to internal supply node N5A-0, and diode element D5A-0a is biased in the reverse direction and maintained in OFF state.

In internal ground voltage generating circuit 5B-0, when supply voltage VCC and ground voltage VSS are applied to pads 3A-0 and 3B-0 respectively, diode element D5B-0b becomes conductive and internal ground node N5B-0 is coupled to pad 3B-0 to receive ground voltage VSS. Diode element D5B-0a enters the reverse biased state and is maintained in OFF state, and thus pad 3A-0 is isolated from internal ground node N5B-0.

When ground voltage VSS and supply voltage VCC are applied to pads 3A-0 and 3B-0 respectively, diode element D5B-0a becomes conductive while diode element D5B-0b becomes non-conductive, and internal ground node N5B-0 is electrically connected to pad 3A-0 to receive ground voltage VSS. In this way, the similar effect can be achieved even if internal supply voltage generating circuit 5A-0 and internal ground voltage generating circuit 5B-0 are structured by such diode logic gates.

First Modification

Figure 6:
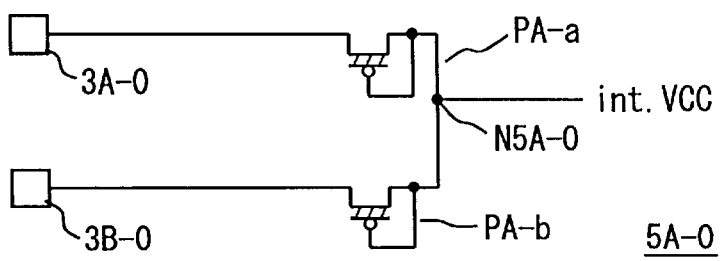
FIG. 6 shows a structure of an internal supply voltage generating circuit according to a modification of the second embodiment.

FIG. 6 is a schematic showing a structure of a modification of internal supply voltage generating circuit 5A-0 shown in FIG. 5. Referring to FIG. 6, a diode-connected depletion type P channel MOS transistor PA-a is placed between pad 3A-0 and internal supply node N5A-0, and a diode-connected depletion type P channel MOS transistor PA-b is placed between pad 3B-0 and internal supply node N5A-0. MOS transistors PA-a and PA-b have a positive threshold voltage and surely transmit supply voltage VCC to internal supply node N5A-0 according to voltage applied to pad 3A-0 or 3B-0 when they become conductive, without loss of the threshold voltage. Use of these depletion type P channel MOS transistors ensures transmission of internal supply voltage intVCC corresponding to externally supplied supply voltage VCC to internal supply node N5A-0 without influence of the forward voltage drop of PN diodes.

Second Modification

Figure 7:
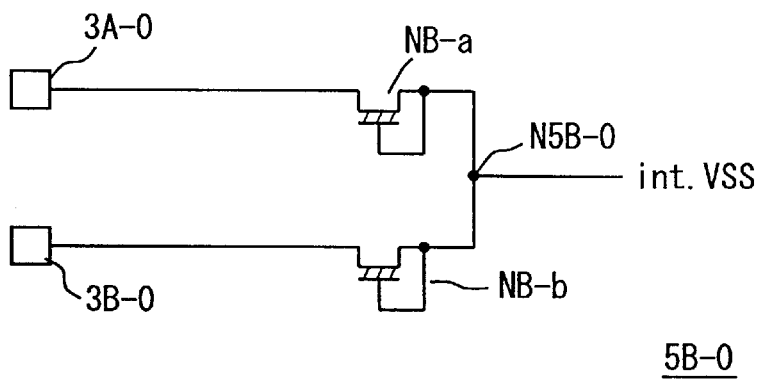
FIG. 7 shows a structure of an internal ground voltage generating circuit according to a modification of the second embodiment.

FIG. 7 is a schematic showing a modification of internal ground voltage generating circuit 5B-0. Referring to FIG. 7, an internal ground voltage generating circuit 5B-0 includes a diode-connected depletion type N channel MOS transistor NB-a placed between pad 3A-0 and internal ground node N5B-0 and a diode-connected depletion type N channel MOS transistor NB-b placed between pad 3B-0 and internal ground node N5B-0.

MOS transistors NB-a and NB-b enter reverse-biased state and enter OFF state when supply voltage VCC is applied to corresponding pads 3A-0 and 3B-0. On the other hand, when ground voltage VSS is applied to corresponding pads 3A-0 and 3B-0, MOS transistors NB-a and NB-b become conductive to transmit ground voltage VSS to internal ground node N5B-0. MOS transistors NB-a and NB-b have a negative threshold voltage (the absolute value thereof is smaller than supply voltage VCC) and ground voltage VSS is surely transmitted to internal ground node N5B-0. In this case, floating-up (rising) of the ground voltage due to the forward voltage drop of the diode elements can be prevented and the ground voltage can surely be transmitted to internal ground node N5B-0.

According to the second embodiment of the invention, the internal supply voltage generating circuit and the internal ground voltage generating circuit are constituted of logic gates employing diode elements and the diode elements are selectively made conductive according to voltages on corresponding pads so as to transmit voltage on the corresponding pad to internal supply/ground node as described above. In this way, the supply voltage and the ground voltage can be transmitted surely and accurately to the chip internal circuit with a small number of components.

Third Embodiment

Figure 8:
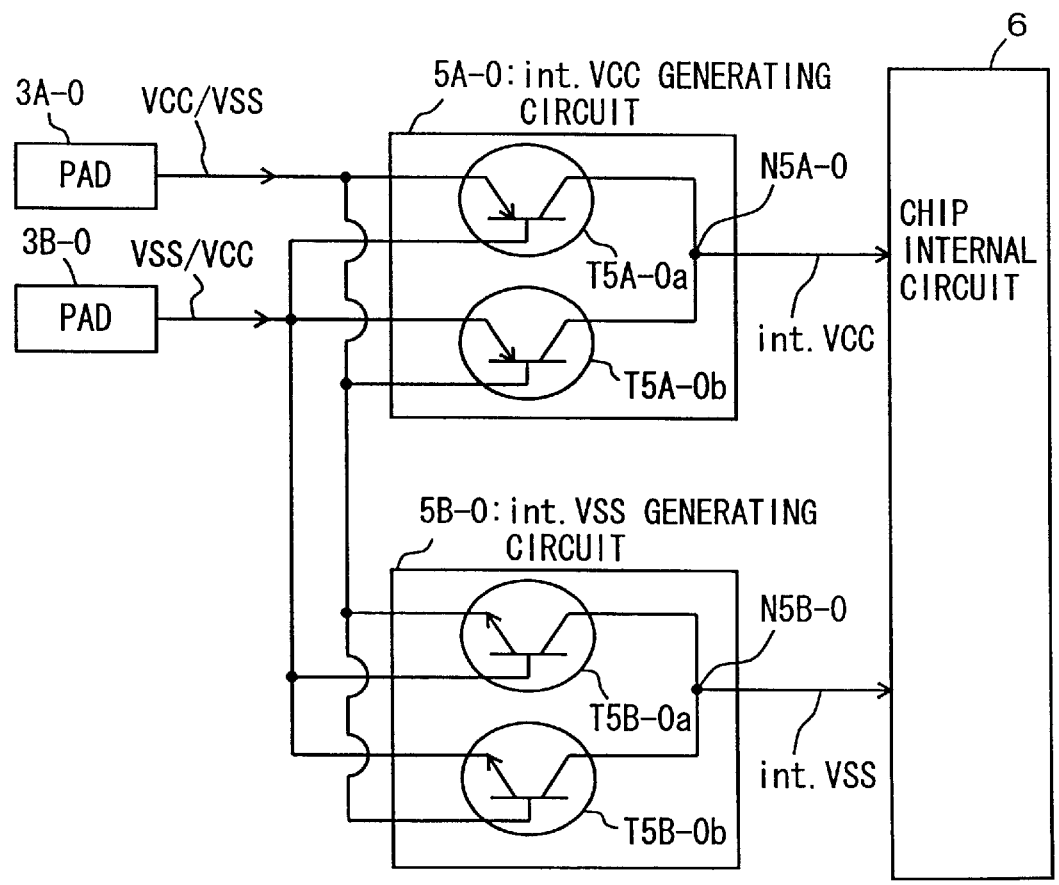
FIG. 8 shows a structure of an internal voltage generating circuit according to a third embodiment of the invention.

FIG. 8 shows a structure of an internal input voltage generating/external output voltage generating circuit 5 according to the third embodiment of the invention. FIG. 8 shows structures of an internal supply voltage (intVCC) generating circuit 5A-0 generating internal supply voltage intVCC and of an internal ground voltage (intVSS) generating circuit generating internal ground voltage intVSS.

Internal supply voltage generating circuit 5A-0 includes: a PNP bipolar transistor T5A-0a which is connected between a pad 3A-0 and an internal supply node N5A-0 and made conductive, when voltage on a pad 3B-0 is at ground voltage VSS level, to transmit voltage on pad 3A-0 to internal supply node N5A-0; and a PNP bipolar transistor T5A-0b which is connected between pad 3B-0 and internal supply node N5A-0 and made conductive, when voltage on pad 3A-0 is at ground voltage VSS level, to transmit voltage on pad 3B-0 to internal supply node N5A-0.

Internal ground voltage generating circuit 5B-0 includes: an NPN bipolar transistor T5B-0a which is connected between pad 3A-0 and an internal ground node N5B-0 and made conductive, when voltage on pad 3B-0 is at supply voltage VCC level, to electrically couple internal ground node N5B-0 to pad 3A-0; and an NPN bipolar transistor T5B-0b which is connected between pad 3B-0 and internal ground node N5B-0 and made conductive, when voltage on pad 3A-0 is at supply voltage VCC level, to electrically couple internal ground node N5B-0 to pad 3B-0. Bipolar transistors T5A-0a and T5B-0a have emitters connected to pad 3A-0 and bipolar transistors T5A-0b and T5B-0b have emitters connected to pad 3B-0.

When supply voltage VCC and ground voltage VSS are applied to pads 3A-0 and 3B-0 respectively, bipolar transistors T5A-0a and T5A-0b respectively enter ON and OFF states in internal supply voltage generating circuit 5A-0. Accordingly, supply voltage VCC on pad 3A-0 is transmitted to internal supply node N5A-0. On the other hand, in internal ground voltage generating circuit 5B-0, bipolar transistor T5B-0b and T5B-0a enter ON and OFF states respectively and internal ground node N5B-0 is electrically coupled to pad 3B-0 via bipolar transistor T5B-0b. Accordingly, internal ground node N5B-0 is at the level of the voltage on pad 3B-0, that is, ground voltage VSS level.

When ground voltage VSS and supply voltage VCC are applied to pads 3A-0 and 3B-0 respectively, bipolar transistors T5A-0a and T5A-0b respectively enter OFF and ON states in internal supply voltage generating circuit 5A-0. In this case, supply voltage VCC on pad 3B-0 is transmitted to internal supply node N5A-0 via bipolar transistor T5A-0b. In internal ground voltage generating circuit 5B-0, bipolar transistors T5B-0a and T5B-0b enter ON and OFF states respectively. Accordingly, internal ground node N5B-0 is electrically coupled to pad 3A-0 via bipolar transistor T5B-0a, and voltage level on internal ground node N5B-0 is at ground voltage VSS level on pad 3A-0.

Regardless of the inserted orientation of the semiconductor device, the structure shown in FIG. 8 allows chip internal circuit 6 to receive internal supply voltage intVCC via internal supply node N5A-0 and internal ground voltage intVSS via internal ground node N5B-0 all the time, so that chip internal circuit 6 can receive internal supply voltage intVCC and internal ground voltage intVSS in a normal manner.

Fourth Embodiment

Figure 9:
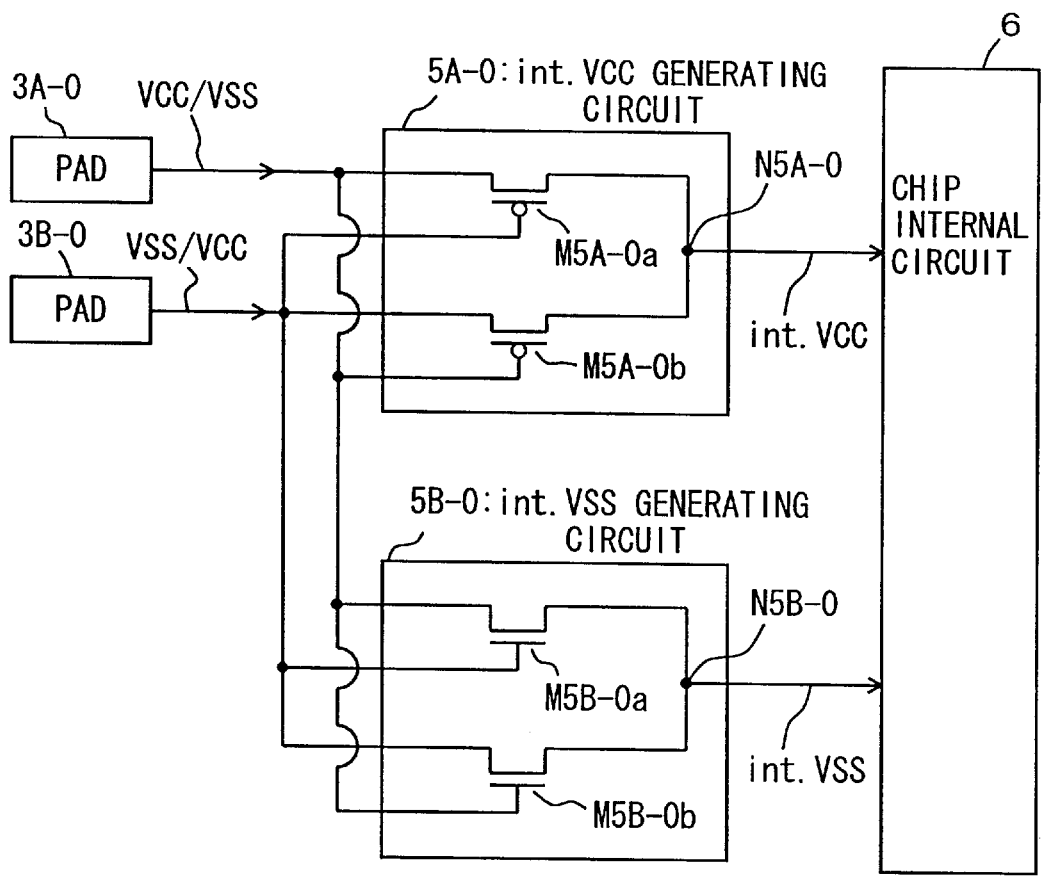
FIG. 9 is a schematic showing a structure of an internal voltage generating circuit according to a fourth embodiment of the invention.

FIG. 9 shows a structure of an internal input voltage generating/external output voltage generating circuit 5 according to the fourth embodiment of the invention. In FIG. 9, structures of circuits which generate internal supply voltage intVCC and internal ground voltage intVSS respectively are shown.

Referring to FIG. 9, an internal supply voltage (intVCC) generating circuit 5A-0 includes: a P channel MOS transistor M5A-0a which becomes conductive, when voltage on a pad 3B-0 is at ground voltage VSS level, to electrically couple a pad 3A-0 to an internal supply node N5A-0; and a P channel MOS transistor M5A-0b which becomes conductive, when voltage on pad 3A-0 is at ground voltage VSS level, to electrically couple pad 3B-0 to internal supply node N5A-0.

An internal ground voltage (intVSS) generating circuit 5B-0 includes: an N channel MOS transistor M5B-0a which becomes conductive, when voltage on pad 3B-0 is at supply voltage VCC level, to electrically couple pad 3A-0 to an internal ground node N5B-0; and an N channel MOS transistor M5B-0b which becomes conductive, when voltage on pad 3A-0 is at supply voltage VCC level, to electrically couple pad 3B-0 to internal ground node N5B-0.

In the structure shown in FIG. 9, when supply voltage VCC and ground voltage VSS are applied to pads 3A-0 and 3B-0 respectively, P channel MOS transistor M5A-0a and N channel MOS transistor M5B-0b enter ON state while P channel MOS transistor M5A-0b and N channel MOS transistor M5B-0a enter OFF state. Accordingly, supply voltage VCC on pad 3A-0 is transmitted to internal supply node N5A-0 and ground voltage VSS on pad 3B-0 is supplied to internal ground node N5B-0.

When ground voltage VSS and supply voltage VCC are applied to pads 3A-0 and 3B-0 respectively, P channel MOS transistor M5A-0b and N channel MOS transistor M5B-0a enter ON state while P channel MOS transistor M5A-0a and N channel MOS transistor M5B-0b enter OFF state. Accordingly, supply voltage VCC on pad 3B-0 is supplied to internal supply node N5A-0 and ground voltage VSS on pad 3A-0 is supplied to internal ground node N5B-0. Chip internal circuit 6 thus receives supply voltage intVCC and ground voltage intVSS in a normal manner via the structure shown in FIG. 9 regardless of the orientation of the semiconductor device upon insertion to the circuit board.

The structure as shown in FIG. 9 also achieves similar effects to those of the first to the third embodiments discussed above. Further, if chip internal circuit 6 has a CMOS structure, internal input voltage generating/external output voltage generating circuit 5 can be formed without additional manufacturing process.

Fifth Embodiment

Figure 10:
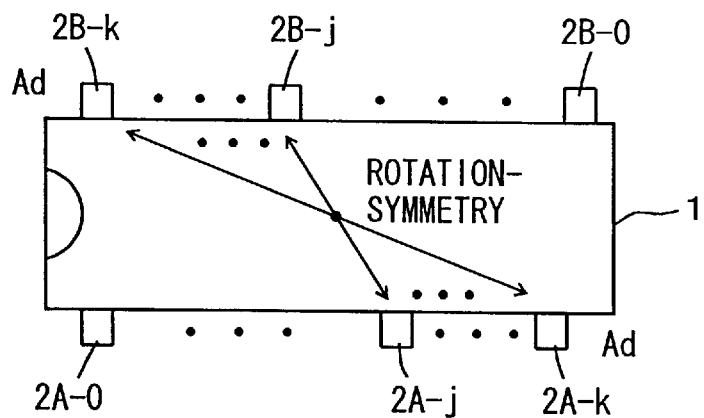
FIG. 10 is a schematic showing a pin arrangement of a semiconductor device according to a fifth embodiment of the invention.

FIG. 10 is a schematic showing a pin arrangement of a semiconductor device according to the fifth embodiment of the invention. Referring to FIG. 10, semiconductor device 1 is a memory device and includes address input pin terminals 2A-j to 2A-k arranged along one longer side for receiving address bits Ad and address input pin terminals 2B-j to 2B-k arranged along the other longer side in rotation-symmetry to address input pin terminals 2A-j to 2A-k for receiving address bits Ad. Terminals 2A-0 and 2B-0 for receiving supply voltage or ground voltage are further arranged on longer sides in rotation-symmetry to each other.

Regardless of the possible orientations (first and second orientations) of semiconductor device 1 upon insertion into a circuit board, semiconductor device 1 having such a pin arrangement as shown in FIG. 10 always receives address signal bits at address input pin terminals 2A-j to 2A-k and 2B-j to 2B-k. Suppose that an address is of 20 bits, Ad0 to Ad19, 10 bits, A0 to A9 thereof are supplied to address pin terminals 2A-j to 2A-k when the semiconductor device is in the first orientation and remaining address bits A10 to A19 are supplied to address pin terminals 2B-j to 2B-k. In this case, a memory cell in a chip internal circuit is selected according to the address A0-A19.

When this semiconductor device mounted on a circuit board is in the second orientation opposite to the first orientation, address bits A10 to A19 are supplied to address pin terminals 2A-j to 2A-k respectively and address bits A0 to A9 are supplied to address pin terminals 2B-j to 2B-k respectively. Under this condition, internal memory selecting operation is performed according to the address A10 to A19 and A0 to A9. Memory selecting operation is internally performed according to the supplied address signal and semiconductor device 1 operates normally when viewed from the outside. The inserted orientation of the device merely changes the physical positions of selected memory cells.

Figure 11:
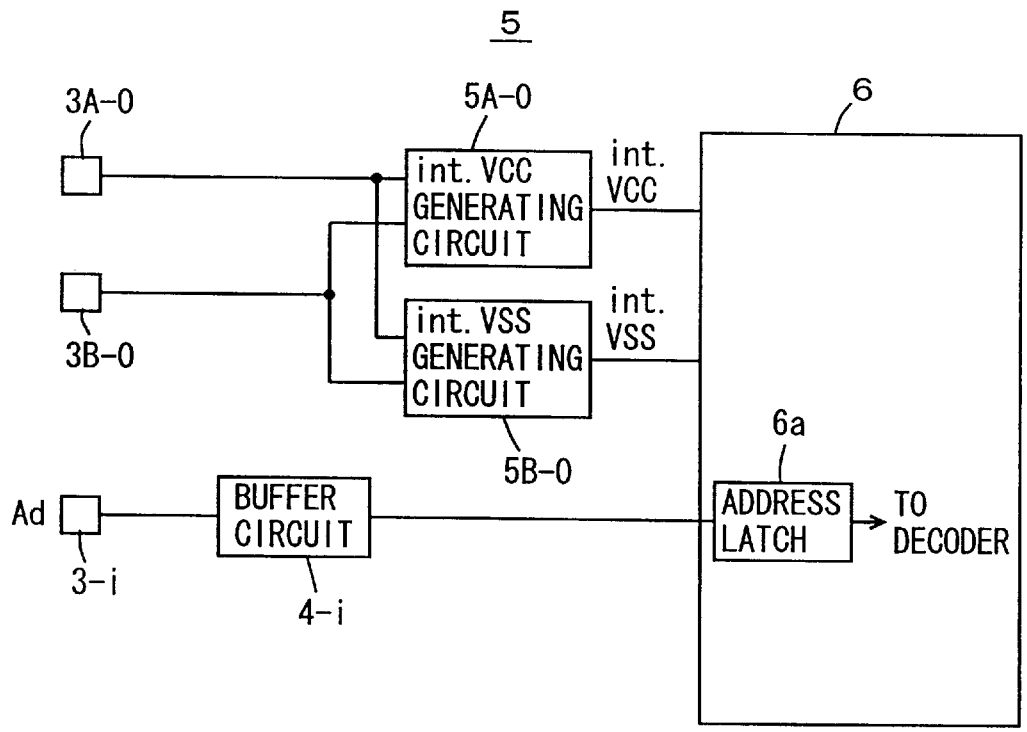
FIG. 11 is a schematic showing a structure of a main portion of the semiconductor device according to the fifth embodiment.

FIG. 11 is a schematic showing a structure of an internal input voltage generating/external output voltage generating circuit of the semiconductor device according to the fifth embodiment. Referring to FIG. 11, for respective pads 3A-0 and 3B-0, an internal supply voltage generating circuit 5A-0 and an internal ground voltage generating circuit 5B-0 are provided. Internal supply voltage intVCC from internal supply voltage generating circuit 5A-0 and internal ground voltage intVSS from internal ground voltage generating circuit 5B-0 are supplied to a chip internal circuit 6.

A pad 3-i receiving address bit Ad is coupled to an address latch circuit 6a included in chip internal circuit 6 via a buffer circuit 4-i. No selection circuit is provided between buffer circuit 4-i and address latch circuit 6a in the subsequent stage. Pad 3-i may be any of pads 3A-i and 3B-i as far as pad 3-i is an address input pad receiving an address bit. Pad 3-i is arranged corresponding to each of address input pin terminals 2A-j to 2A-k and 2B-j to 2B-k shown in FIG. 10.

Even if semiconductor device 1 is mounted on the circuit board in the reverse orientation, pad 3-i receives an address bit. Therefore, if an output signal of buffer circuit 4i is supplied to address latch circuit 6a, memory selecting operation is performed according to the supplied address signal in chip internal circuit 6. No transmission gate is required between buffer circuit 4-i and address latch circuit 6a for selecting a correct address signal bit. Consequently, signal propagation delay in the transmission gate or transfer gate can be avoided and high speed transmission of an address signal to address latch circuit 6a of chip internal circuit 6 is possible, so that a semiconductor device operating at high speed can be implemented.

It is noted that any structures of the first to the fourth embodiments may be employed as the structures of internal supply voltage generating circuit 5A-0 and internal ground voltage generating circuit 5B-0.

First Modification

Figure 12:
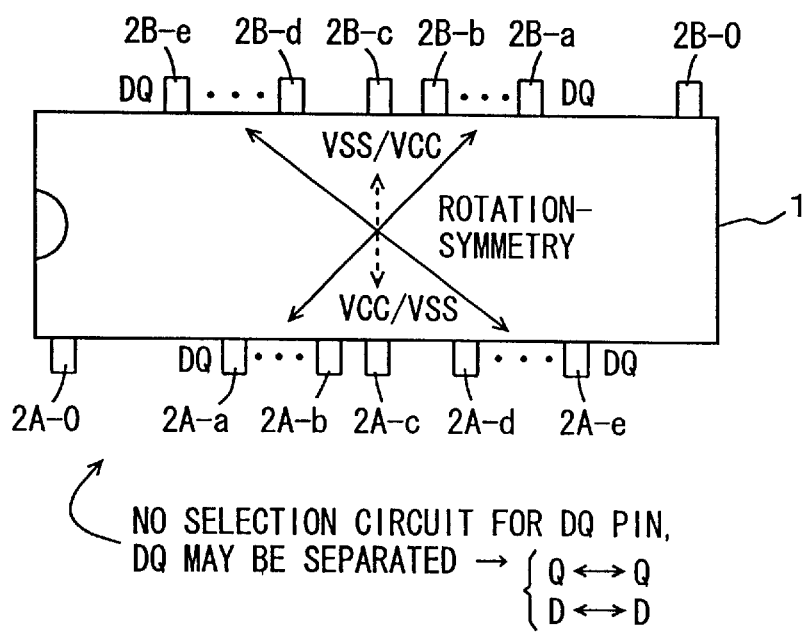
FIG. 12 is a schematic showing a modification of the fifth embodiment.

FIG. 12 is a schematic showing a structure of the first modification of the fifth embodiment. Referring to FIG. 12, a semiconductor device 1 is a semiconductor memory device having pin terminals for input/output of data DQ. Specifically, semiconductor device 1 includes, along one longer side thereof, DQ pin terminals 2A-a to 2A-b for input/output of data, a power supply pin terminal 2A-c for receiving supply voltage VCC when the semiconductor device is inserted in the first orientation, and DQ pin terminals 2A-d to 2A-e. Further, a pin terminal 2A-0 is provided on the one longer side of semiconductor device 1 for receiving supply voltage VCC when the device is inserted in the first orientation.

Semiconductor device 1 further includes, along the other longer side, DQ pin terminals 2B-a to 2B-b for input/output of data, a ground terminal 2B-c for receiving ground voltage VSS when the device is inserted in the first orientation, DQ pin terminals 2B-d to 2B-e, and a pin terminal 2B-0 for receiving ground voltage VSS when the device is inserted in the first orientation. DQ terminals 2A-a to 2A-b and pin terminals 2B-a to 2B-b are arranged in rotation-symmetry to each other, and DQ pin terminals 2A-d to 2A-e are arranged in rotation-symmetry to DQ pin terminals 2B-d to 2B-e. Pin terminals 2A-c and 2B-c are placed opposite and in rotation-symmetry to each other.

A selection circuit as shown in FIG. 11 is provided to pin terminals 2A-0, 2A-c, 2B-0 and 2B-c. However, for DQ pin terminals 2A-a to 2A-b, 2A-d to 2A-e, 2B-a to 2B-b and 2B-d to 2B-e, no selection circuit is provided for changing connection depending on the inserted orientation of semiconductor device 1, as shown in the structure of FIG. 11. Although bit positions of data DQ may vary in semiconductor device 1, memory cells store the data bits and an external device can accordingly receive data having the same data bit position sequence regardless of the inserted orientation of semiconductor device 1. Specifically, for data writing, data bits are stored in memory cells with bit positions changed internally according to the positions of pin terminals in semiconductor device 1. For data reading, the positions of bits located at the changed positions are changed again to the original, normal positions at the pin terminals, and then data having the bits at the original positions is transmitted to an external device. In this way, the external device can accurately supply/receive data bits without influence of the inserted orientation of semiconductor device 1.

It is noted that DQ pin terminals are arranged in rotation-symmetry to each other. However, semiconductor device 1 may have a separated DQ structure in which input data D and output data Q are input/output through separate pin terminals. In this case, pin terminals for output of output data Q are arranged in rotation-symmetry to each other, and pin terminals for receiving input data D are arranged in rotation-symmetry to each other. It is only required that the order of changing bit positions of input data D in the semiconductor device is the same as the order of changing bit positions upon output of output data Q.

Second Modification

Figure 13:
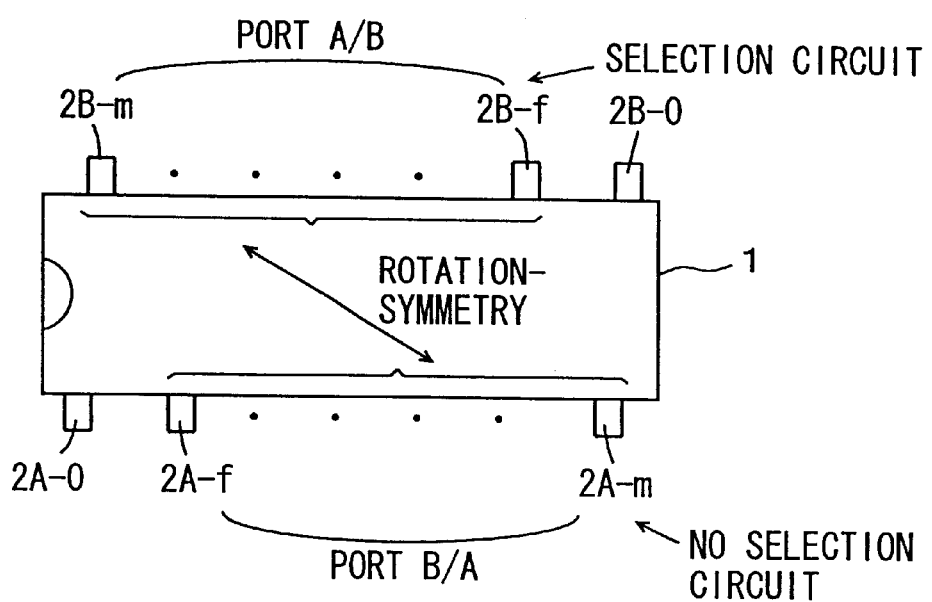
FIG. 13 is a schematic showing a second modification of the fifth embodiment.

FIG. 13 is a schematic showing a structure of the second modification of the fifth embodiment. Referring to FIG. 13, a semiconductor device 1 is a two-port memory and has pin terminals 2A-f to 2A-m on one longer side and pin terminals 2B-f to 2B-m on the other longer side. Pin terminals 2A-f to 2A-m and pin terminals 2B-f to 2B-m are arranged in rotation-symmetry to each other. Pin terminals 2A-f to 2A-m transmit/receive data to/from an external device placed in one of ports A and B, and pin terminals 2B-f to 2B-m transmit/receive data to/from an external device placed in the other port. The set of pin terminals 2A-f to 2A-m and the set of pin terminals 2B-f to 2B-m each include pin terminals for an address signal, a data bit and a control signal.

The pin terminals for one port are arranged in rotation-symmetry to the pin terminals for the other port. Therefore, even if ports A and B are replaced with each other, internal access is made to memory cells according to the arrangement of connected pin terminals. The external device makes access to semiconductor device 1 without consideration of access route, i.e., whether the access is made through port A or port B of semiconductor device 1. There is no need in this case to change the propagation route of signals/voltages according to the inserted orientation of semiconductor device 1, and no selection circuit is provided regarding pin terminals 2A-f to 2A-m and 2B-f to 2B-m. Only switching circuits for supply voltage VCC and ground voltage VSS applied to pin terminals 2A-0 and 2B-0 are provided. Accordingly, data/signals can be transmitted/received not through a selection circuit and thus high speed access is achieved.

Semiconductor device 1 as discussed above is not limited to the semiconductor memory. Even if semiconductor device 1 is a general semiconductor integrated circuit device, no selection circuit is necessary for specific pin terminals, provided that the internal operation does not change even if pin terminal positions change and different signals are input/output.

According to the fifth embodiment as described above, no selection circuit is provided for corresponding pin terminals if a normal internal operation is possible even when the pin terminals and signals are differently connected. Consequently, it is possible to avoid signal propagation delay in the selection circuit, achieve a high speed operation, and reduce the area occupied by the selection circuit and accordingly reduce the chip area.

Sixth Embodiment

Figure 14:
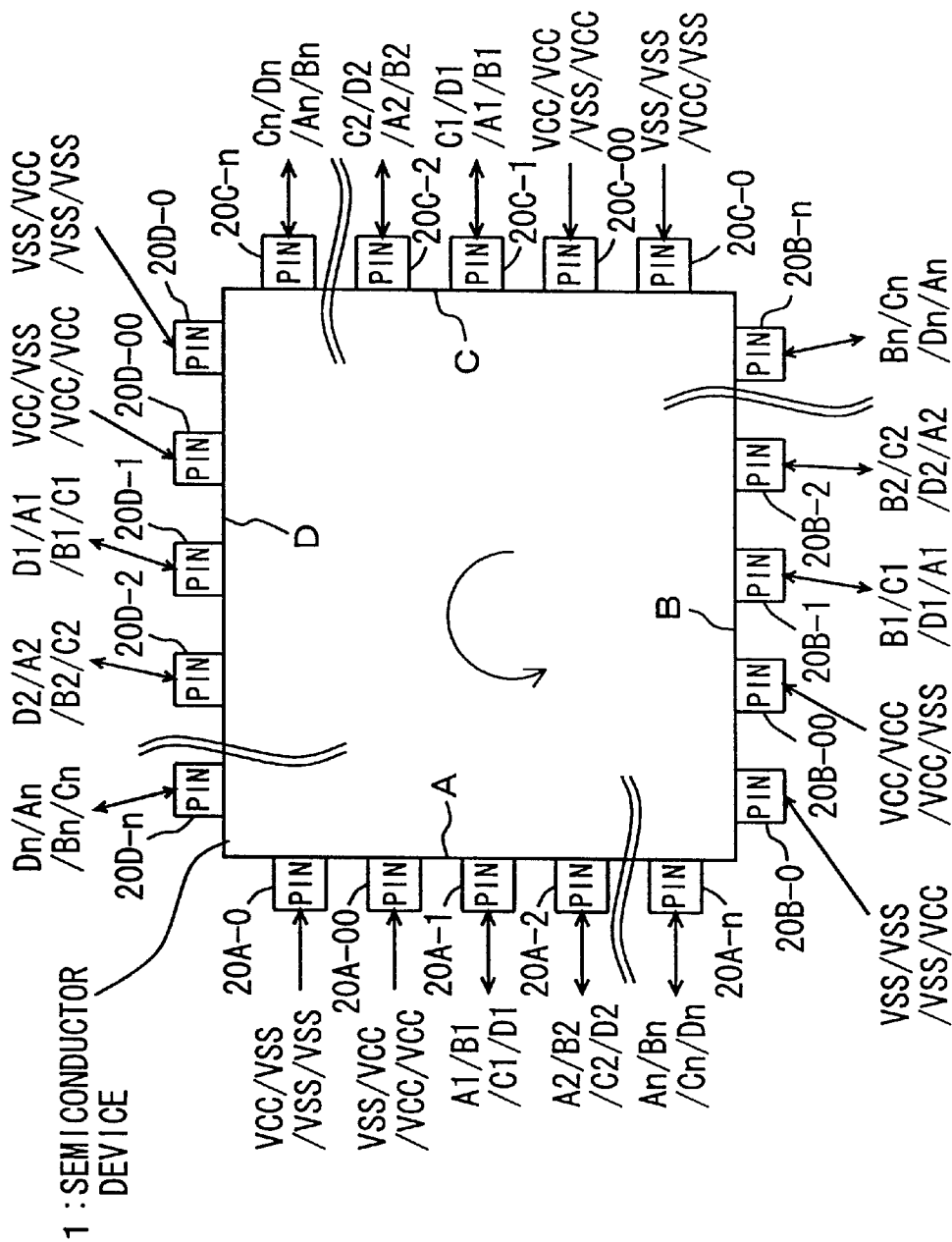
FIG. 14 is a schematic showing a pin arrangement of a semiconductor device according to a sixth embodiment of the invention.

FIG. 14 is a schematic showing a pin arrangement of a semiconductor device according to the sixth embodiment of the invention. Semiconductor device 1 shown in FIG. 14 is mounted in a flat package (FP). Accordingly, pin terminals are arranged along four sides A, B, C and D of semiconductor device 1. Specifically, pin terminals 20A-0 to 20A-n are arranged along side A, pin terminals 20B-0 to 20B-n are arranged along side B, pin terminals 20C-0 to 20C-n are arranged along side C and pin terminals 20D-0 to 20D-n are arranged along side D.

With regard to semiconductor device 1, if this flat package is square in shape, the pin terminals are arranged at the same pitch and accordingly the semiconductor device can be mounted in an IC socket or the like at any of the four angles different from each other by 90°. In this case, semiconductor device 1 should internally operate correctly in any of the four states. In order to accommodate this, a pair of pin terminals receiving supply voltage VCC and ground voltage VSS complementary to each other are arranged along each side. Specifically, pin terminals 20A-0 and 20A-00 are arranged along side A as supply/ground pin terminals. Along each of side B, side C and side D, supply/ground pin terminals are arranged such that the pin terminals overlap the original positions of pin terminals 20A-0 and 20A-00 when the semiconductor device is rotated by 90°. Specifically, pin terminals 20B-0 and 20B-00, 20C-0 and 20C-00, and 20D-0 and 20D-00 are provided on side B, side C and side D respectively. Although the paired pin terminals shown are arranged side by side, they may be arranged apart from each other. It is merely necessary that supply/ground pin terminals form so-called "C4 symmetry" in which pin terminals on one side overlap original positions of pin terminals on another side when the semiconductor device is rotated about the center thereof by 90°.

Pin terminals 20A-1 to 20A-n, 20B-1 to 20B-n, 20C-1 to 20C-n, and 20D-1 to 20D-n each receive a signal or voltage. In the structure of semiconductor device 1 shown in FIG. 14, the signal/voltage supplied to each pin terminal varies for each rotation by the angle of 90°. Therefore, in order to adapt to the four states, a switch adapted to the four states is provided in a selection circuit. These four states are identified by arranging voltages, which are applied to one pair of pin terminals 20A-0 and 20A-00 when the semiconductor device is inserted in one of four possible orientations (the one orientation is hereinafter referred to as first state), such that the voltages are opposite respectively to those applied to other pairs of pin terminals 20B-0 and 20B-00, 20C-0 and 20C-00, and 20D-0 and 20D-00. In other words, when supply voltage VCC and ground voltage VSS are applied to respective pin terminals 20A-0 and 20A-00 in the first state, ground voltage VSS is applied to other pin terminals 20B-0, 20C-0 and 20D-0 and supply voltage VCC is applied to other pin terminals 20B-00, 20C-00 and 20D-00. In this way, the rotation angle or inserted orientation of the device is identified. FIG. 14 illustrates transition of voltage and signal at each pin terminal when semiconductor device 1 is rotated anti-clockwise.

Figure 15:
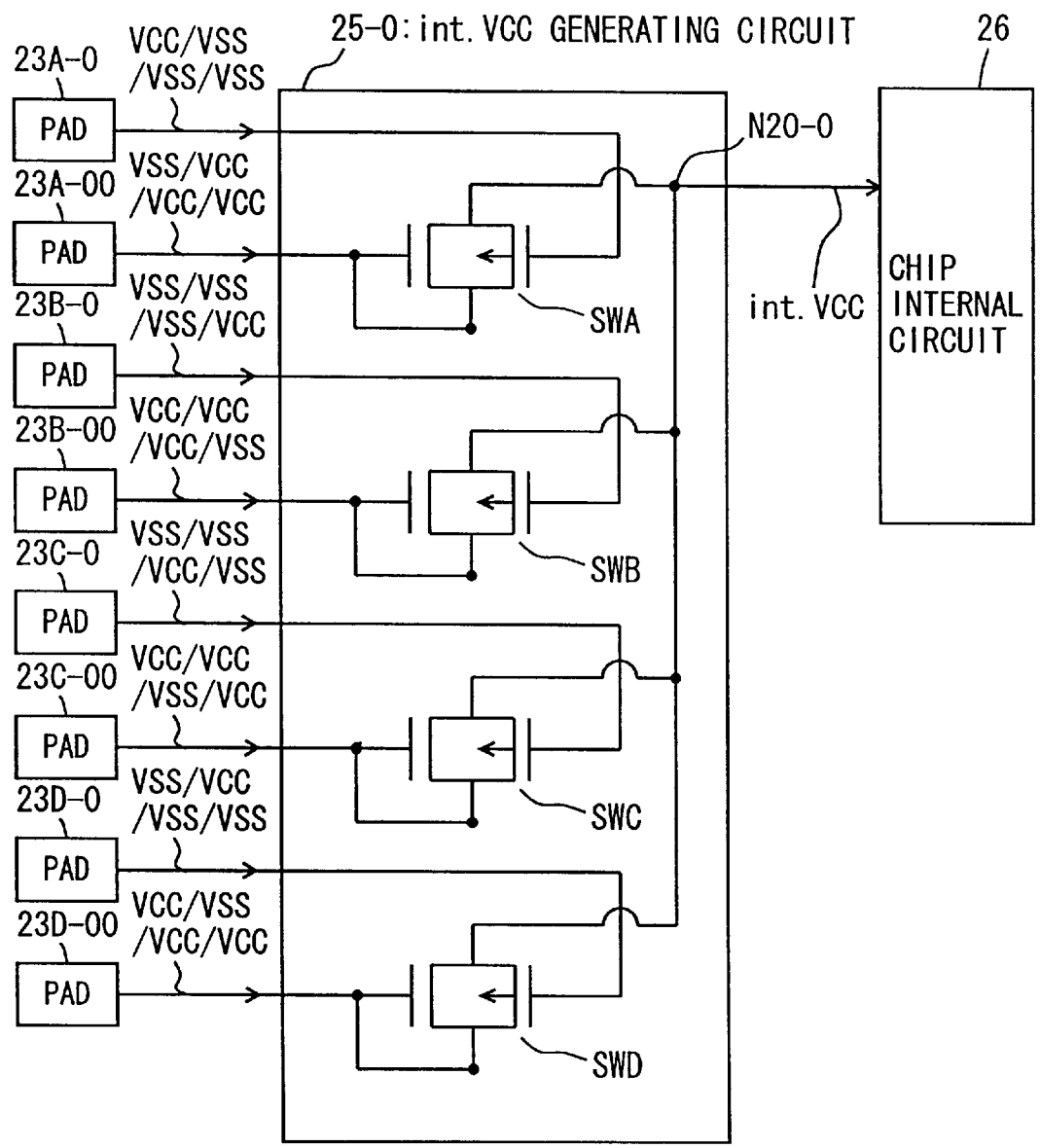
FIG. 15 is a schematic showing a structure of an internal supply voltage generating circuit of the semiconductor device shown in FIG. 14.

FIG. 15 shows a structure of an internal supply voltage (intVCC) generating circuit 25-0 for supplying internal supply voltage intVCC to a chip internal circuit 26. Internal supply voltage generating circuit 25-0 receives voltages on pads 23A-0, 23A-00, 23B-0, 23B-00, 23C-0, 23C-00, 23D-0 and 23D-00 provided corresponding to respective supply pin terminals. Internal supply voltage generating circuit 25-0 includes: a switching circuit SWA which is provided corresponding to pads 23A-0 and 23A-00 and made conductive, when voltage on pad 23A-0 is at ground voltage level, to transmit voltage on pad 23A-00 to an internal node N20-0; a switching circuit SWB provided corresponding to pads 23B-0 and 23B-00 and made conductive, when voltage on pad 23B-0 is at ground voltage VSS level, to electrically couple pad 23B-00 to internal supply node N20-0; a switching circuit SWC provided corresponding to pads 23C-0 and 23C-00 and made conductive, when voltage on pad 23C-0 is at ground voltage VSS level, to transmit voltage on pad 23C-00 to internal supply node N20-0; and a switching circuit SWD provided corresponding to pads 23D-0 and 23D-00 and made conductive, when voltage on pad 23D-0 is at ground voltage VSS level, to transmit voltage on pad 23D-00 to internal supply node N20-0. These switching circuits SWA to SWD are each constituted of a CMOS transmission gate.

When the inserted orientation of semiconductor device is the first state in which pin terminals 20A-0 and 20A-00 receive supply voltage VCC and ground voltage VSS respectively, pads 23A-0, 23B-00, 23C-00 and 23D-00 receive supply voltage VCC while pads 23A-00, 23B-0, 23C-0 and 23D-0 receive ground voltage VSS. Accordingly, only switching circuit SWA is in the non-conductive state while other switching circuits SWB-SWD are all in the conductive state so that supply voltage VCC applied to pads 23B-00, 23C-00 and 23D-00 is transmitted to internal supply node N20-0. Three switching circuits SWB-SWD are conductive among four switching circuits SWA-SWD so that supply voltage VCC is fed to internal supply node N20-0 stably.

When semiconductor device 1 is rotated anti-clockwise by 90°, pin terminal 20D-0 is located at the original position of pin terminal 20A-0. Then, pads 23D-0 and 22D-00 receive supply voltage VCC and ground voltage VSS respectively. Pads 23A-0, 23B-0 and 23C-0 receive ground voltage VSS while pads 23A-00, 23B-00 and 23C-00 receive supply voltage VCC. Accordingly, switching circuit SWD becomes non-conductive and remaining three switching circuits SWA-SWC become conductive so that supply voltage VCC is applied to internal supply node N20-0. Subsequently, each time the semiconductor device is rotated anti-clockwise by 90°, switching circuits SWC and SWB become non-conductive in this order and thus supply voltage VCC is transmitted to internal supply node N20-0 by three switching circuits.

Supply/ground terminals are arranged on the rectangular chip such that voltages are applied to paired supply and ground terminals on one side differently from voltages applied to other paired supply and ground terminals on other sides in order to detect the rotation angle of the semiconductor device and accurately supply internal supply voltage to the internal supply node.

Figure 16:
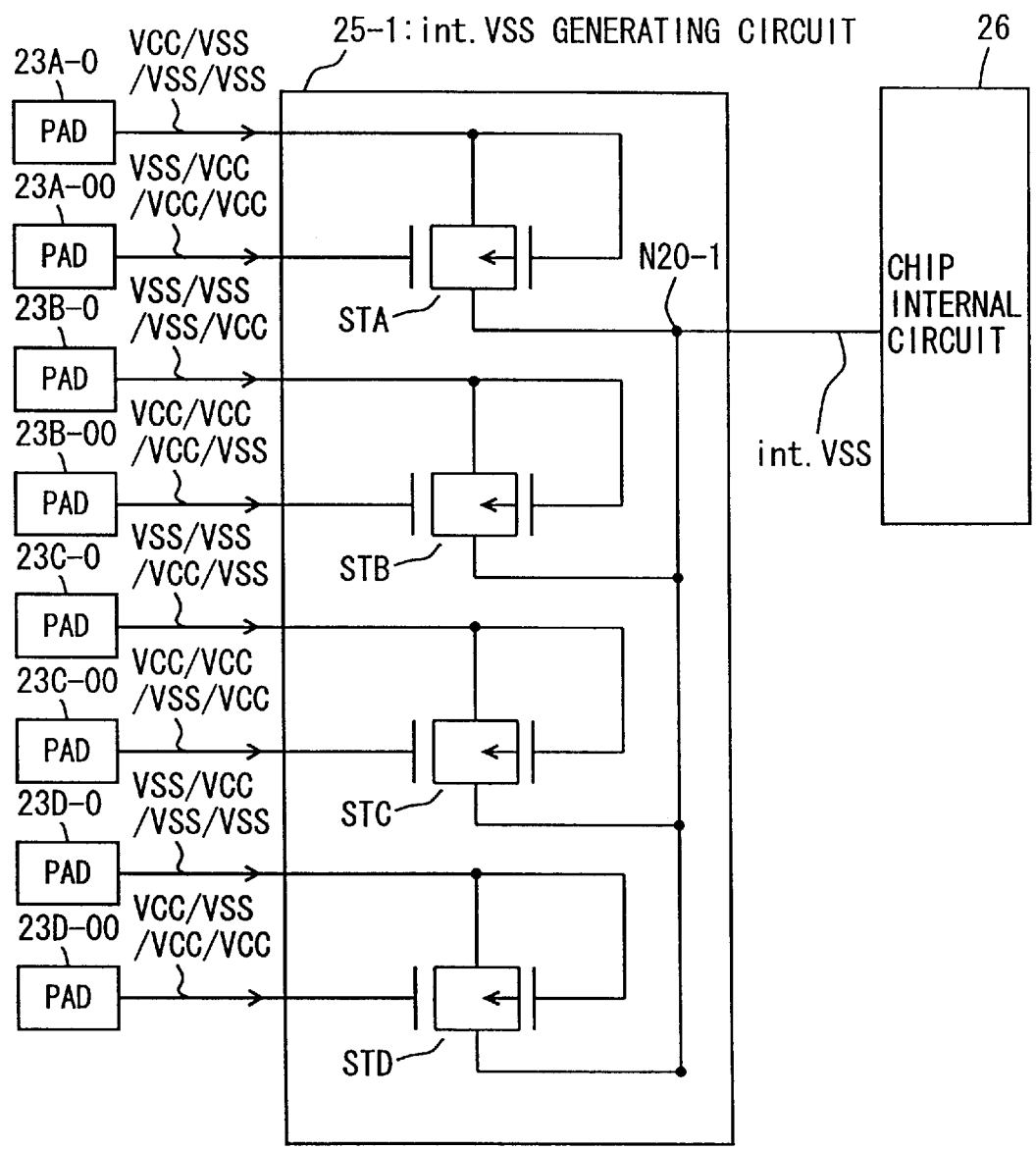
FIG. 16 is a schematic showing a structure of an internal ground voltage generating circuit of the semiconductor device shown in FIG. 14.

FIG. 16 shows a structure of an internal ground voltage generating circuit 25-1 for generating internal ground voltage intVSS in an internal input voltage generating/external output voltage generating circuit 25. Referring to FIG. 16, internal ground voltage (intVSS) generating circuit 25-1 includes: a switching circuit STA provided corresponding to pads 23A-0 and 23A-00 and made conductive, when voltage on pad 23A-0 is at ground voltage VSS level, to transmit voltage on pad 23A-0 to an internal ground node N20-1; a switching circuit STB provided corresponding to pads 23B-0 and 23B-00 and made conductive, when voltage on pad 23B-0 is at ground voltage VSS level, to transmit voltage on pad 23B-0 to internal ground node N20-1; a switching circuit STC provided corresponding to pads 23C-0 and 23C-00 and made conductive, when voltage on pad 23C-0 is at ground voltage VSS level, to transmit voltage on pad 23C-0 to internal ground node N20-1; and a switching circuit STD provided corresponding to pads 23D-0 and 23D-00 and made conductive, when voltage on pad 23D-0 is at ground voltage VSS level, to transmit voltage on pad 23D-0 to internal ground node N20-1. Switching circuits STA to STD each are constituted of a CMOS transmission gate, receive voltage on a corresponding pair of pads, and transmit the voltage on the pad without voltage loss onto internal ground node N20-1.

When the semiconductor device is in the first state, voltage on pad 23A-0 is at supply voltage VCC level and voltage on pad 23A-00 is at ground voltage VSS level. Ground voltage VSS is applied to pads 23B-0 to 23D-0 and supply voltage VCC is applied to pads 23B-00 to 23D-00. In this state, switching circuit STA is non-conductive and switching circuits STB to STD are conductive so that ground voltage VSS is transmitted to internal ground node N20-1 via three conducting switching circuits STB to STD.

When the semiconductor device arranged as shown in FIG. 14 is rotated anti-clockwise by 90°, pin terminal 22D-0 is located at the original position of terminal 22A-0. Accordingly, supply voltage VCC is applied to pad 23D-0 and ground voltage VSS is applied to 23D-00. Pads 23A-0 to 23C-0 receive ground voltage VSS and pads 23A-00 to 23C-00 receive supply voltage VCC. Consequently, switching circuit STD is non-conductive and switching circuits STA to STC are conductive so that ground voltage VSS is transmitted to internal ground node N20-1 via these three conducting switching circuits STA to STC.

If the semiconductor device is then rotated anti-clockwise by another 90° successively to be mounted on a circuit board, switching circuits STC and STB become non-conductive successively and remaining three switching circuits become conductive. Ground voltage VSS is thus applied to internal ground node N20-1 via three switching circuits.

As shown in FIGS. 15 and 16, switching circuits SWA to SWD as well as switching circuits STA to STD can be employed to constantly supply internal supply voltage intVCC and internal ground voltage intVSS to chip internal circuit 26 via three switching circuits in a stable manner.

In the structure of internal supply voltage generating circuit 25-0 shown in FIG. 15, switching circuits SWA to SWD formed of CMOS transmission gates may have transistors of opposite polarity to use internal supply voltage generating circuit 25-0 as internal ground voltage generating circuit 25-1, and the structure shown in FIG. 16 of internal ground voltage generating circuit 25-1 may have switching circuits STA to STD formed of CMOS transmission gates with transistors of opposite polarity to serve as internal supply voltage generating circuit 25-0. In this case, in each of internal supply voltage generating circuit 25-0 and internal ground voltage generating circuit 25-1, only one switching circuit may be conductive to supply each of internal supply voltage intVCC and internal ground voltage intVSS via one pad.

Figure 17:
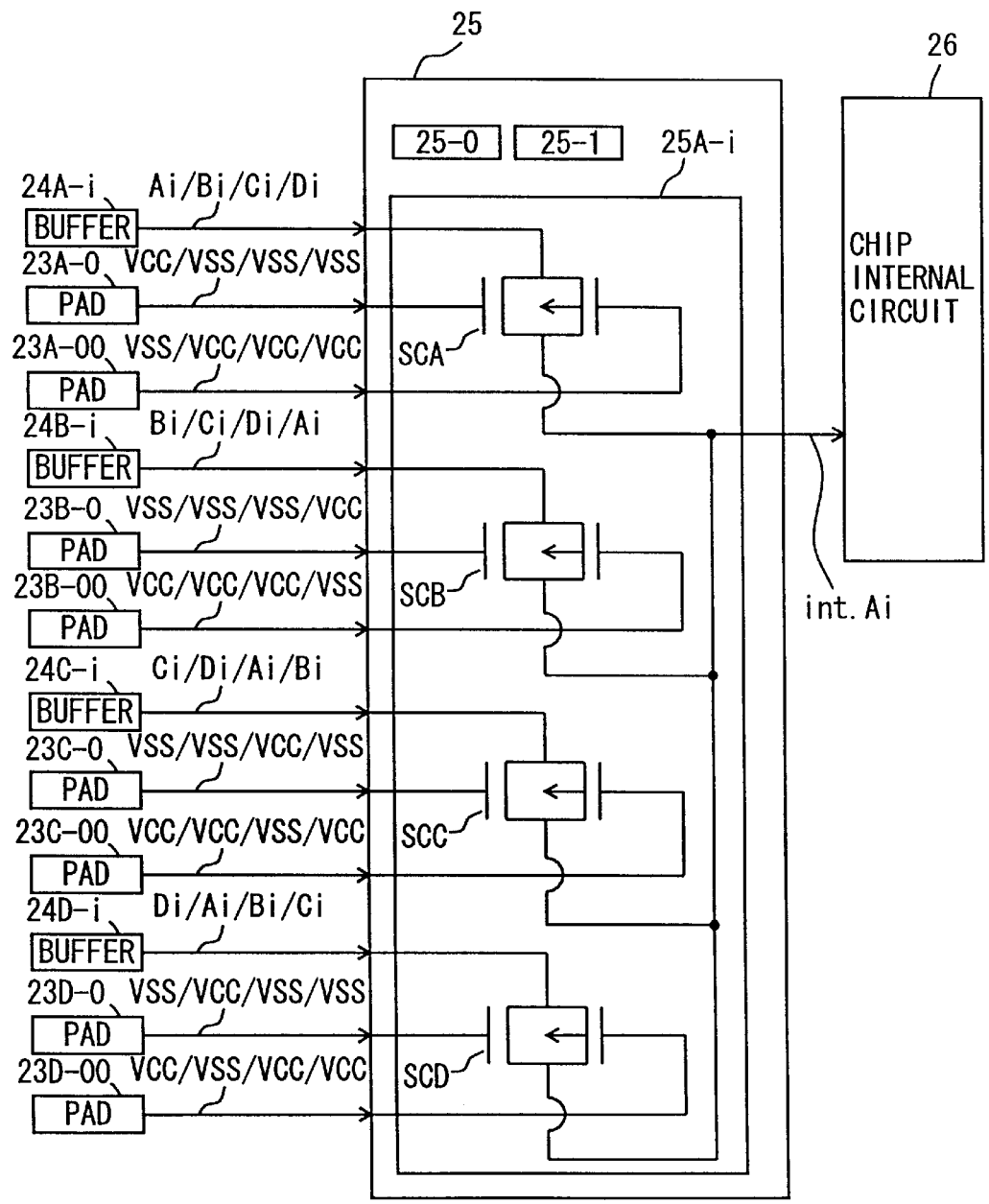
FIG. 17 is a schematic showing a structure of a signal selection circuit of the semiconductor device shown in FIG. 14.

FIG. 17 shows a structure of a selection circuit 25A-i for internal signal intAi. Internal input voltage generating/external output voltage generating circuit 25 includes internal supply voltage generating circuit 25-0 and internal ground voltage generating circuit 25-1 described above in conjunction with FIGS. 15 and 16. A selection circuit having a similar structure to that of selection circuit 25A-i shown in FIG. 17 is employed for other internal signals.

Referring to FIG. 17, selection circuit 25A-i includes: a switching circuit SCA which selectively becomes conductive, in response to voltages on pads 23A-0 and 23A-00, to couple a buffer circuit 24A-i to an internal node N20-i; a switching circuit SCB which selectively becomes conductive, in response to voltages on pads 23B-0 and 23B-00, to couple a buffer circuit 24B-i to internal node N20-i; a switching circuit SCC which selectively becomes conductive, in response to voltages on pads 23C-0 and 23C-00, to couple a buffer circuit 24C-i to internal node N20-i; and a switching circuit SCD which becomes conductive, in response to voltages on pads 23D-0 and 23D-00, to electrically couple a buffer circuit 24D-i to internal node N20-i. These switching circuits are each constituted of a CMOS transmission gate.

Switching circuit SCA becomes conductive when pad 23A-0 receives supply voltage VCC and pad 23A-00 receives ground voltage VSS. Switching circuit SCB becomes conductive when pad 23B-0 receives supply voltage VCC and pad 23B-00 receives ground voltage VSS. Switching circuit SCC becomes conductive when pad 23C-0 receives supply voltage VCC and pad 23C-00 receives ground voltage VSS. Switching circuit SCD becomes conductive when pads 23D-0 and 23D-00 receive supply voltage VCC and ground voltage VSS respectively. In this way, selection circuit 25A-i detects the rotation angle of the semiconductor device based on voltages on pads 23A-0 to 23D-0 and 23A-00 to 23D-00 to select a corresponding buffer circuit according to the rotation angle, and couples the selected buffer circuit to internal node N20-i. Therefore, if semiconductor device 1 is inserted to the circuit board in the first state, switching circuit SCA becomes conductive while switching circuits SCB to SCD become non-conductive so that buffer circuit 24A-i is coupled to internal node N20-i. In the first state, buffer circuit 24A-i supplies/receives internal signal intAi to/from chip internal circuit 26. Buffer circuits 24A-i to 24D-i are input buffers, output buffers or input/ output buffers and the direction of signal transmission is determined according to the natures of the buffer circuits.

If the semiconductor device as shown in FIG. 14 is rotated anti-clockwise by 90° and mounted on the circuit board, pads 23D-0 and 23D-00 receive supply voltage VCC and ground voltage VSS respectively. As a result, pin terminal 20D-i associated with pad 23D-i corresponding to buffer circuit 24D-i is coupled to signal Ai. At this time, switching circuit SCD is conductive to couple buffer circuit 24D-i to internal node N20-i. Subsequently, when the semiconductor device is rotated anti-clockwise by another 90° successively, switching circuits SCC and SCB are accordingly made conductive in this order, and buffer circuits 24C-i and 24B-i coupled to signal Ai are successively coupled to internal node N20-i.

As discussed above, one pair of supply terminals is provided on each side of the semiconductor device, and voltages are applied to the paired terminals on one of the sides differently from voltages applied to paired supply terminals on the rest of the sides in order to detect rotation angle of the semiconductor device. A buffer circuit can be selected according to the rotation angle for correctly communicating signals with any external device all the time.

Figure 18:
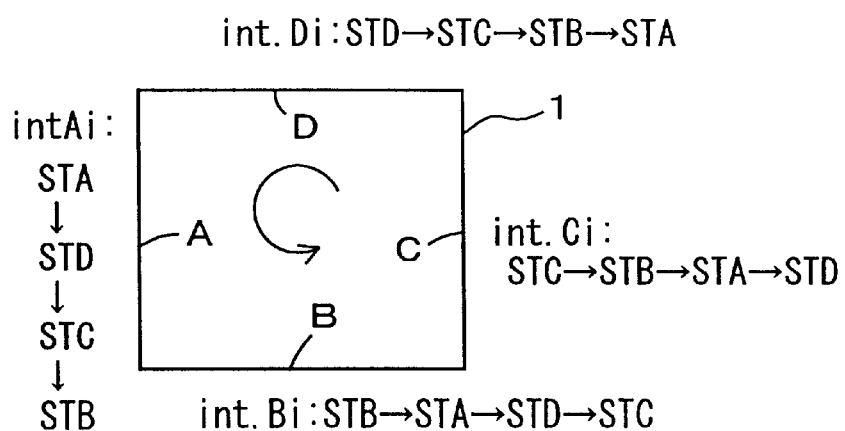
FIG. 18 is a schematic illustrating a manner of selection for internal connection of signal terminals of the semiconductor device shown in FIG. 14.

FIG. 18 illustrates the order in which switching circuits become conductive in selection circuits for internal signals intBi, intci and intDi corresponding to pin terminals provided on sides B, C and D. Suppose that semiconductor device 1 is rotated anti-clockwise 90° by 90° to be mounted on a circuit board. For each of internal signals intBi, intci and intDi, a selection circuit having the structure as shown in FIG. 17 is provided. Here, the destinations of connection of supply/ground pads for the switching circuits are shifted one by one according to the positions of the sides. Specifically, for internal signal intBi, switching circuits STB, STA, STD and STC are made conductive successively in this order (for each rotation by 90°). For internal signal intCi, switching circuits STC, STB, STA and STD are made conductive in this order for each rotation by 90°. For internal signal intDi, switching circuits STD, STC, STB and STA are made conductive in this order for each anti-clockwise rotation by 90°. Each of internal signals intAi to intDi is thus correlated with an external signal accurately.

According to the sixth embodiment of the invention as described above, even when a semiconductor device on a chip having pin terminals arranged along the four sides of the chip can be mounted on a circuit board with the semiconductor device is rotated 90° by 90°, connections between pads and internal nodes can be changed according to the rotation angle. Therefore, the semiconductor device can operate normally even when the semiconductor device is wrongly inserted.

The layout within internal input voltage generating/ external output voltage generating circuit 25 is appropriately determined according to the structure of chip internal circuit 26. For example, internal input voltage generating/external output voltage generating circuit 25 may be arranged extending along the periphery of the semiconductor chip to surround chip internal circuit 26. If pin terminals are provided along the four sides of a semiconductor device as the pin terminals of a flat package, pads on the semiconductor chip are also arranged along the four sides of the chip and buffer circuits are provided corresponding to respective pads and accordingly arranged extending along the periphery of the semiconductor chip. In this case, selection circuits may be arranged accordingly to extend along the periphery of the chip to surround the internal circuit. Here, interconnection lines from supply pin terminals (supply terminal and ground terminal) arranged on the four sides of the chip should extend over the entire selection circuits.

Seventh Embodiment

Figure 19:
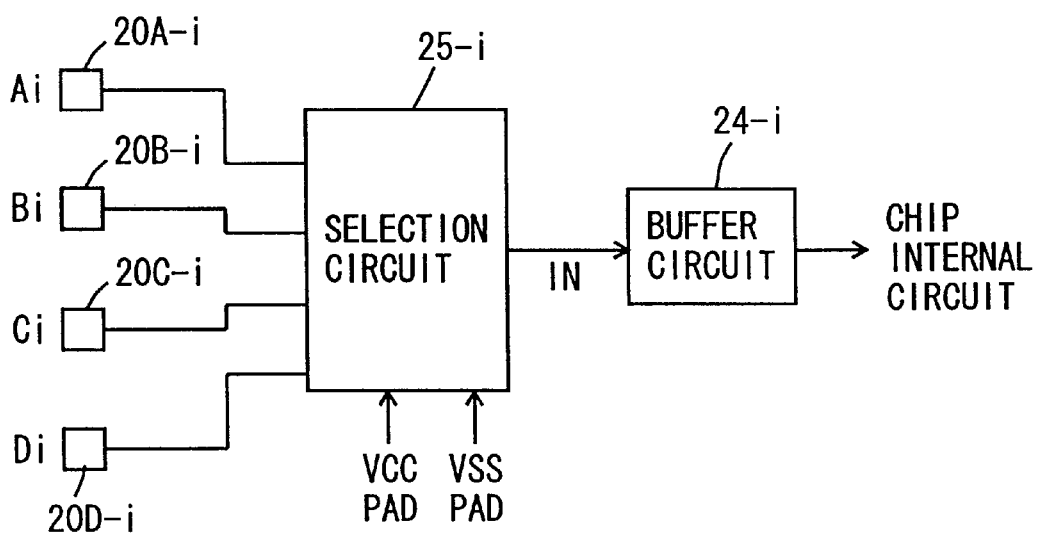
FIG. 19 is a schematic showing a structure of a main portion of a semiconductor device according to a seventh embodiment of the invention.

FIG. 19 is a schematic showing a structure of a main portion of a semiconductor device according to the seventh embodiment of the invention. Referring to FIG. 19, a selection circuit 25-i is provided between pads 20A-i to 20D-i and a buffer circuit 24-i. Selection circuit 25-i receives voltages from VCC and VSS pads and detects the inserted orientation of the semiconductor device to couple one of pads 20A-i to 20D-i to buffer circuit 24-i. The VCC and VSS pads correspond to pads 23A-0, 23A-00 to 23D-0 to 23D-00 in the sixth embodiment above.

The structure shown in FIG. 19 eliminates the need of arranging pins of the same type, among input pin terminals, output pin terminals and input/output pin terminals, at positions in rotation-symmetry to each other because selection circuit 25-i selects an appropriate pad to couple it to buffer circuit 24-i. Specifically, even when four buffer circuits including buffer circuit 24-i corresponding to pads 20A-i to 20D-i each are any of an input buffer circuit, an output buffer circuit and an input/output buffer circuit, selection circuit 25-i selects a pad for input/output (or only input or only output) of a signal corresponding to buffer circuit 24-i and couples the selected pad to buffer circuit 24-i. Consequently, the freedom in pin terminal arrangement is enhanced.

The structure as shown in FIG. 19 is applicable to a structure having pin terminals arranged along two sides of a semiconductor device package. In other words, the seventh embodiment is applicable to all structures of the first to the sixth embodiments above. Buffer circuits can be arranged according to the structure of a chip internal circuit and layout is simplified.

According to the seventh embodiment as described above, a selection circuit (switch circuit) is placed between pads and a buffer circuit for changing connection path according to the inserted orientation of a semiconductor device in order to couple a correct pad to the circuit all the time. It is not required to arrange elements having the same characteristic (input/output pins, output pins or input pins) at positions in rotation-symmetry, and buffer circuits can be arranged based on the structure of the chip internal circuit. The layout of the buffer circuits is simplified.

Eighth Embodiment

Figure 20:
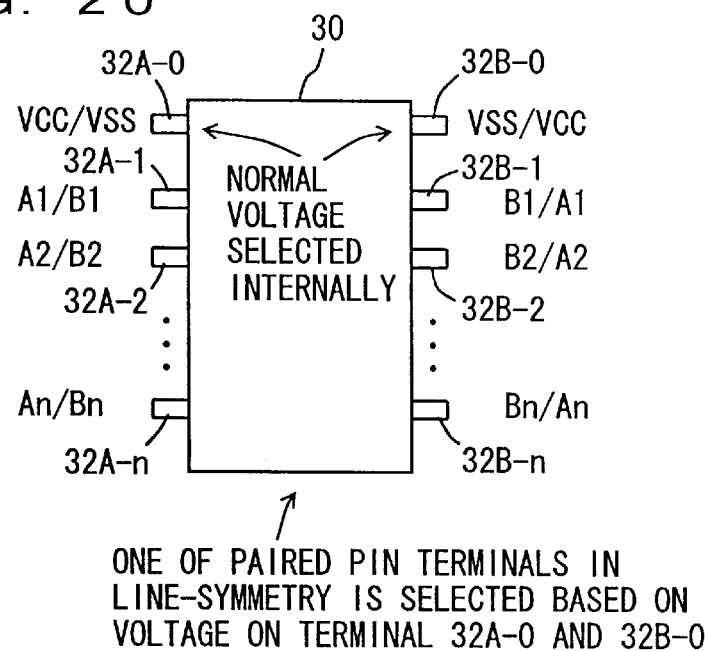
FIG. 20 is a schematic showing a structure of a semiconductor device according to an eighth embodiment of the invention.

FIG. 20 is a schematic showing a pin arrangement of a semiconductor device according to the eighth embodiment of the invention. Referring to FIG. 20, semiconductor device 30 includes a supply terminal 32A-0 and signal input/output terminals 32A-1 to 32A-n on its one longer side and a supply terminal 32B-0 and signal pin terminals 32B-1 to 32B-n on the other longer side. Supply pin terminals 32A-0 and 32B-0 are arranged in line-symmetry to each other with respect to the axis along the longer sides. Semiconductor device 30 is reversible or is indistinguishable in front and rear, while top and bottom thereof can be distinguished by detecting whether the positions of terminals 32A-0 and 32B-0 are at an upside or at a down-side relative to terminals 32A-n and 32B-n. If a TSOP (Thin Small Outline Package) is used, for example, semiconductor devices called forward bent product and reverse bent product are formed by bending pin terminals in the forward direction and the reverse direction respectively. The forward and reverse bent products are mounted on the front side and the rear side respectively of a circuit board. Voltages on supply pin terminals 32A-0 and 32B-0 are detected to determine the orientation of the semiconductor device mounted on the circuit board and then couple a pad to a chip internal circuit. A selection circuit may be located between a buffer circuit and the chip internal circuit as illustrated in the first to the sixth embodiments or between the pad and the buffer circuit as illustrated in the seventh embodiment.

The orientation of the semiconductor device is detected based on the voltages on supply pin terminals 32A-0 and 32B-0. This structure can be implemented by employing the structure of the selection circuit that is illustrated in the first to the sixth embodiments above. Instead of pin terminals located in rotation-symmetry, paired pin terminals located in line-symmetry are coupled to one selection circuit. If the pin arrangement as shown in FIG. 20 is employed, a semiconductor device with the same function can be implemented regardless of whether it is mounted on one side surface or the other side surface of the circuit board, for example. The interconnection layout on the circuit board is accordingly simplified.

In addition, it is unnecessary to separately fabricate the forward bent product and the reverse bent product as required by the TSOP package, and the forward bent product can be operated accordingly as the reverse bent product easily.

The structure shown in FIG. 20 has pin terminals arranged on both sides of the semiconductor device. However, the same effect can be achieved even if pin terminals are arranged along the four sides of the semiconductor device. Suppose that the pin terminals are provided on the four sides as done for a QFP, for example, and the semiconductor device is square in shape, and therefore, conditioned that which of its two opposing sides is located on which side of the socket is detected, it can be determined whether the semiconductor device is in the front or rear orientation based on voltages applied to two supply pin terminals located in line-symmetry, as done in the structure having pin terminals arranged on two opposing sides of the semiconductor device. Thus, the semiconductor device can be used as the forward bent product and the reverse bent product as described above.

Simplification of the interconnection layout is further possible by alternately arranging forward or reverse bent products on the same surface of the circuit board to enable the same signal/voltage to be supplied to pin terminals facing to each other.

According to the eighth embodiment as described above, power supply pins are arranged in line-symmetry, select operation is done internally by a selection circuit according to voltages on these supply terminals, and one of paired pin terminals is selected based on the voltages on the supply terminals. In this way, a semiconductor device indistinguished in front and rear side can be implemented.

Ninth Embodiment

Figure 21A:
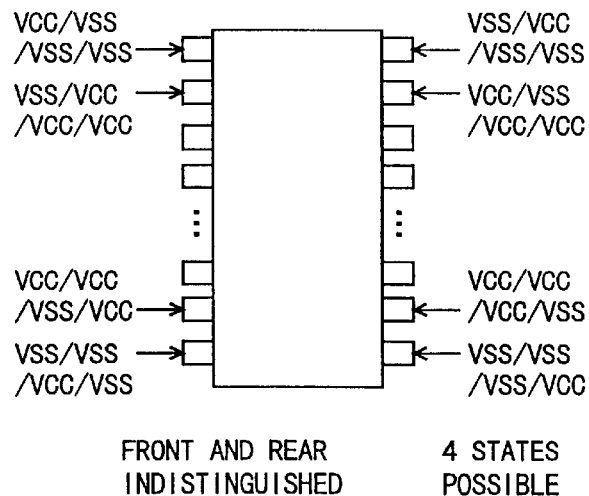
FIGS. 21A and 21B are schematics showing a structure of a semiconductor device according to a ninth embodiment of the invention.

FIG. 21A is a schematic showing a pin arrangement of a semiconductor device according to the ninth embodiment. The semiconductor device shown in FIG. 21A has pin terminals arranged along the longer sides of the package. FIG. 21A shows supply terminals. The semiconductor device is indistinguishable in front and rear and in top and bottom so that the device can be inserted in any orientation. Specifically, the semiconductor device may be rotated by 180° about a line parallel to the longer side thereof as an axis of rotation, i.e. the semiconductor device may be turned frontside rear, may be rotated by 180 ° on the horizontal plane, or may be rotated by 180 ° (to turn its topside bottom) and turned frontside rear (mirror symmetry inversion), then inserted to the circuit board. In other words, there are four states for the inserted orientation of the semiconductor device to the circuit board. In order to distinguish these four states from each other, a pin terminal located at the same position in all the four states should be used as a supply pin terminal. Eight supply pins are used for distinguishing the four states. According to applied voltages to paired supply pin terminals, the inserted orientation of the semiconductor device to the circuit board is detected. As shown in FIG. 21A, voltage applied to a supply pin terminal is determined such that voltages applied to one pair of supply terminals are different from voltages applied to the remaining three pairs of respective supply terminals. Applied voltages shown in FIG. 21A at each terminal are the one in a first state, the one in the frontside-rear state, the one in the topside-bottom state (semiconductor device is rotated by 180 ° on the horizontal plane), and the one in the frontside-rear and topside-bottom state.

Referring to FIG. 21A, the voltages applied to the upper two pin terminals on the right longer side of the chip are different from those applied to remaining three pairs of respective pin terminals. The inserted orientation of the semiconductor device is detected based on the position of the pins for the differently applied voltages.

Figure 21B:
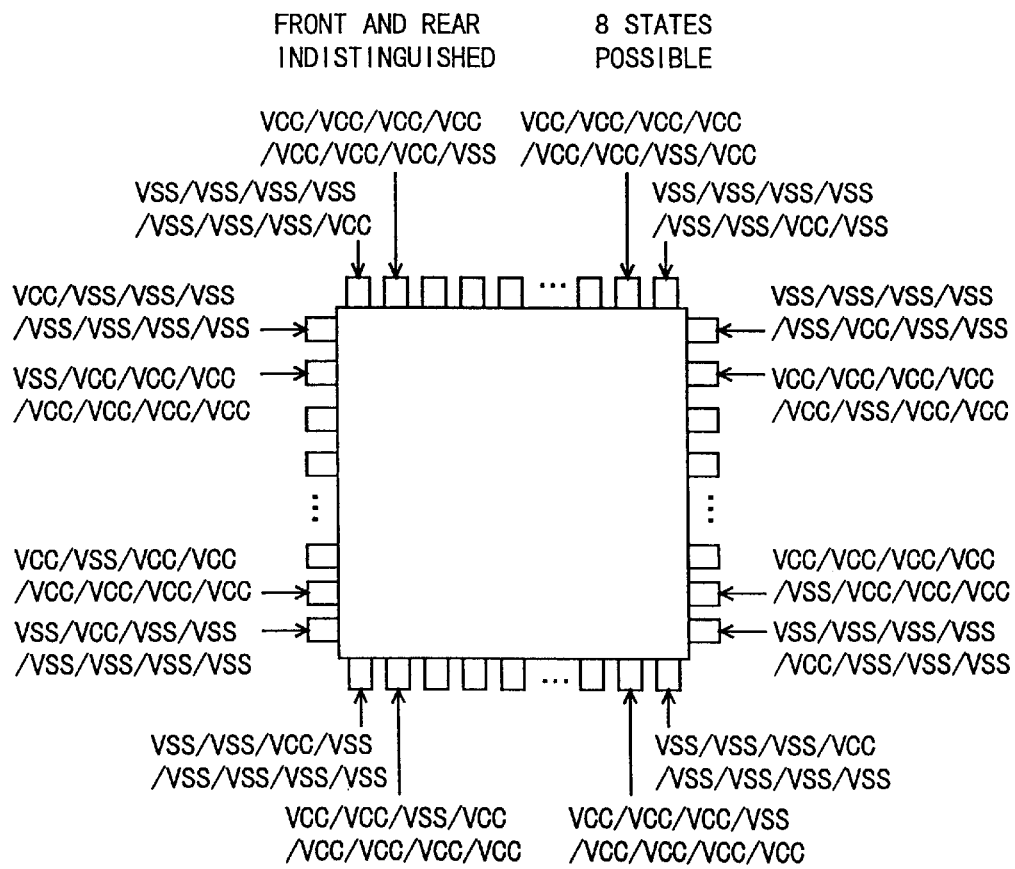
Figure 22:
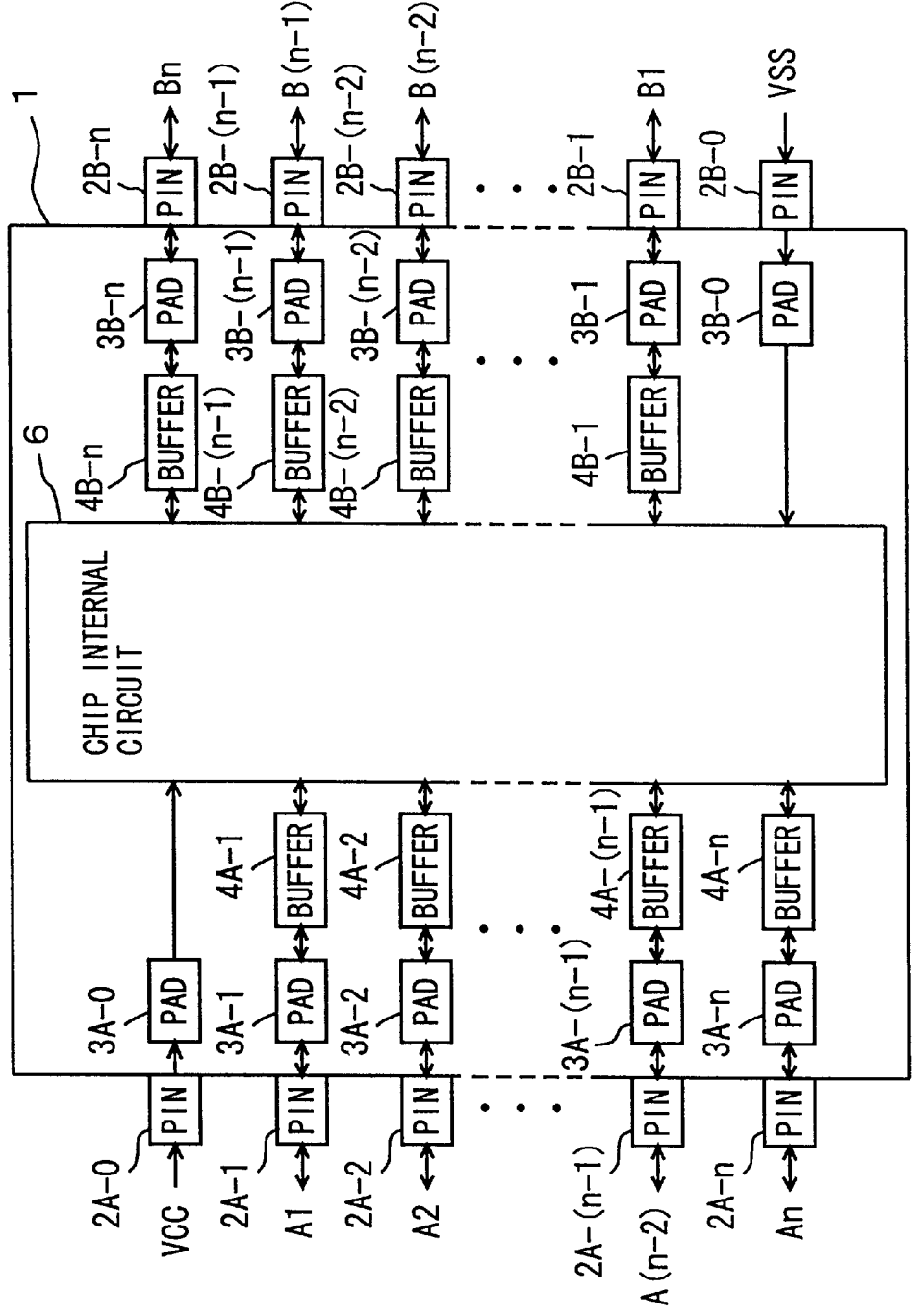
FIG. 22 is a schematic showing a structure of a conventional semiconductor device.

FIG. 21B shows a structure of a modification of the ninth embodiment. A semiconductor device shown in FIG. 21B is square in shape with pin terminals arranged along the four sides. In this case, rotation of the semiconductor device on the horizontal plane generates four states and an additional turning frontside rear thereof generates additional four states. Thus, total 8 states or orientations are possible concerning inserted orientation of the semiconductor device. In order to detect these eight orientations (states), two pairs of supply terminals are arranged on each side. Referring to FIG. 21B, the applied voltages shown at each pin terminal correspond to the voltages applied when the semiconductor device is rotated anti-clockwise 90° by 90° and then turned frontside rear and rotated 90° by 90°, respectively. In the first state, voltages applied to one pair of supply terminals are different from voltages applied to the remaining seven pairs of supply terminals. In FIG. 21B, the voltages applied to the upper pair of supply pin terminals on the left side are different from those to remaining seven pairs of pin terminals. The position of the pins for the differently applied voltages is detected for detecting the rotational direction and front/rear.

Regardless of the inserted orientation of the semiconductor device, normal operation of the semiconductor device is achieved by detection of the orientation. Depending on whether the applied voltage is supply voltage VCC or ground voltage VSS, the inserted orientation of the semiconductor device can be specified. Therefore, the number of supply pin terminals necessary for detecting the orientation is at least the number of orientations (states) which the semiconductor device can take. Suppose that supply voltage VCC is applied to one supply pin terminal in a first orientation and ground voltage is applied thereto in other states (orientations). Only an N channel MOS transistor is employed as a selection circuit for that one supply pin terminal and the applied voltage is supplied from that one supply pin terminal to the gate of the N channel MOS transistor. According to such arrangement, only the N channel MOS transistor corresponding to the supply pin terminal receiving supply voltage VCC becomes conductive so that the orientation can be detected and selection can be made.

A supply pin terminal and another supply pin terminal receiving ground voltage VSS in the first orientation and receiving supply voltage VCC in other orientations, i.e. total two pin terminals are necessary. If at least three orientations are possible for the inserted state of the semiconductor device, the number of necessary pin terminals is at least two times as much as that number of possible orientations. If two orientations are possible for insertion of the semiconductor device, at least two supply pin terminals are enough as implemented in the first embodiment.

Other Applications

The present invention is applicable to various types of semiconductor integrated circuit devices having a semiconductor package which can be mounted on a circuit board with the package rotated on a two dimensional plane or in three dimensional space.

Supply and ground pin terminals may be any in number, but are required at least to be arranged in line-symmetry or rotation-symmetry in two-dimensional plane or in three-dimensional space. The invention is further applicable to semiconductor devices having other CSPs (Chip Size Packages). The semiconductor integrated circuit device may be a module. In this case, an internal input voltage generating/external output voltage generating circuit is arranged between a pin terminal and an internal chip interconnection line.

The present invention can be applied to a semiconductor device of any shape as far as the semiconductor device is shaped in rotation-symmetry relative to a certain angle in plan view or in line-symmetry. The selection circuit may be located at any position on a path between a portion of external application of voltages/signals and a portion of actual use thereof within the device, or between a portion of definition of signals/voltages and a portion of actual, external output thereof. For example, as for input data, the selection circuit may be on a write data bus, and as for output data, the selection circuit may be on a read data bus.

According to the present invention as discussed above, the orientation of a semiconductor device when mounted on a circuit board is specified based on voltage on a supply pad and a correct signal/voltage is selected to be supplied to an internal circuit according to the specified orientation. Consequently, a semiconductor device which always operates normally regardless of the orientation in mounting thereof on the circuit board can be provided. Thus, improvement of manufacturing yield, simplified process of mounting the semiconductor device on a circuit board, and simplified interconnection layout on the circuit board are achieved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:

a plurality of external terminals;

an internal circuit receiving a voltage on an internal node as one operating supply voltage; and a selection circuit coupled to said plurality of external terminals for selecting the voltage to be transmitted to said internal node from voltages on said plurality of external terminals and supplying a selected voltage to said internal node according to the voltages on said plurality of external terminals, wherein said plurality of external terminals include a plurality of pairs of first and second terminals, and said selection circuit includes a plurality of switching elements provided corresponding to said plurality of pairs of first and second terminals respectively, and selectively made conductive, in response to voltages on the first and second terminals of corresponding pairs, for electrically coupling a predetermined one of the first and second terminals of the corresponding pairs to said internal node.

2. The semiconductor device according to claim 1, wherein said semiconductor device has a predetermined geometrical shape and includes a plurality of signal terminals, on said geometrical shape, arranged at positions in one of rotation-symmetry and line-symmetry, for receiving signals of a same kind, and said plurality of signal terminals are coupled to corresponding nodes of said internal circuit regardless of voltage levels on said plurality of external terminals.

3. The semiconductor device according to claim 1, wherein said plurality of external terminals are arranged at positions in one of rotation-symmetry and line-symmetry to each other.

4. The semiconductor device according to claim 1, wherein said plurality of pairs are arranged at positions in one of line-symmetry and rotation-symmetry to each other, and voltage is applied to one pair of respective external terminals differently from voltage applied to other pairs of respective external terminals.

5. A semiconductor device comprising:

a plurality of external terminals;

an internal circuit receiving a voltage on an internal node as one operating power supply voltage;

a selection circuit coupled to said plurality of external terminals for selecting the voltage transmitted to said internal node from voltages on said plurality of external terminals and supplying a selected voltage to said internal node according to the voltages on said plurality of external terminals;

a plurality of signal terminals; and coupling circuitry provided corresponding to said plurality of external terminals, for electrically coupling one of said plurality of signal terminals to a second internal node different from said internal node in response to voltages on said plurality of external terminals, said second internal node coupled to said internal circuit.

6. The semiconductor device according to claim 5, wherein said internal circuit includes a buffer circuit coupled to said second internal node for buffering a supplied signal.

7. The semiconductor device according to claim 5, wherein said plurality of external terminals include first and second terminals; and said selection circuit includes a pair of switching elements provided corresponding to said first and second terminals, respectively, said pair of switching elements responsive to voltages on said first and second terminals respectively for coupling one of said first and second terminals to said internal node.

8. The semiconductor device according to claim 7, wherein said semiconductor device has a predetermined geometrical shape and includes a plurality of signal terminals, on said geometrical shape, arranged at positions in one of rotation-symmetry and line-symmetry, for receiving signals of a same kind, and said plurality of signal terminals are coupled to corresponding nodes of said internal circuit regardless of voltage levels on said plurality of external terminals.

9. The semiconductor device according to claim 5, wherein said internal circuit includes a buffer circuit coupled to said second internal node for buffering a supplied signal.

10. The semiconductor device according to claim 5, wherein said plurality of external terminal are arranged at positions in one of rotation-symmetry and line-symmetry to each other.

* * * * *